(12) United States Patent
Freeman et al.

(10) Patent No.: US 11,189,516 B2
(45) Date of Patent: Nov. 30, 2021

(54) METHOD FOR MASK AND SUBSTRATE ALIGNMENT

(71) Applicant: Applied Materials, Inc., Santa Clara, CA (US)

(72) Inventors: Greg Freeman, Austin, TX (US); Patricia A. Schulze, Giddings, TX (US); Ozkan Celik, Ced, CA (US); Alexander N. Lerner, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 37 days.

(21) Appl. No.: 16/807,860

(22) Filed: Mar. 3, 2020

(65) Prior Publication Data

US 2020/0371448 A1 Nov. 26, 2020

Related U.S. Application Data

(60) Provisional application No. 62/878,469, filed on Jul. 25, 2019, provisional application No. 62/852,748, filed on May 24, 2019.

(51) Int. Cl.
*H01L 21/68* (2006.01)
(52) U.S. Cl.
CPC .................. *H01L 21/682* (2013.01)
(58) Field of Classification Search
CPC .. G03F 7/70741; G03F 7/7075; G03F 9/7003; G03F 9/7019; G03F 9/7076; G03F 9/7073; H01L 51/0011; H01L 21/682
See application file for complete search history.

(56) References Cited

U.S. PATENT DOCUMENTS

| 4,071,944 A | 2/1978 | Chuss et al. |
| 4,549,843 A | 10/1985 | Jagusch et al. |

(Continued)

FOREIGN PATENT DOCUMENTS

| CN | 1490169 A | 4/2004 |
| CN | 102460129 A | 5/2012 |

(Continued)

OTHER PUBLICATIONS

International Search Report and Written Opinion dated Aug. 20, 2020 for Application No. PCT/US2020/030868.

(Continued)

*Primary Examiner* — Steven Whitesell Gordon
(74) *Attorney, Agent, or Firm* — Patterson + Sheridan, LLP

(57) ABSTRACT

Methods and apparatuses for aligning masks with substrates are provided. A method can include receiving a carrier having a substrate disposed thereon at an alignment stage of an alignment module, transferring a mask from a mask cassette of a mask stocker of the alignment module to a position over the alignment stage, and positioning the mask on the carrier. The method can also include acquiring one or more images of the mask and the substrate, where the mask contains one or more alignment holes passing through the mask and the substrate contains one or more alignment dots disposed on an upper surface of the substrate, analyzing the one or more images to determine one or more differences between one or more alignment holes of the mask and one or more alignment dots on the substrate, and aligning the mask with the substrate based on the differences.

20 Claims, 11 Drawing Sheets

(56) References Cited

U.S. PATENT DOCUMENTS

| | | |
|---|---|---|
| 4,915,057 A | 4/1990 | Boudreau et al. |
| 4,952,420 A | 8/1990 | Walters |
| 5,354,380 A | 10/1994 | Zejda |
| 5,503,675 A | 4/1996 | Zejda |
| 5,909,030 A | 6/1999 | Yoshitake et al. |
| 6,665,053 B2 | 12/2003 | Korenaga |
| 6,886,803 B2 | 5/2005 | Mikiya et al. |
| 7,148,502 B2 | 12/2006 | Yamazaki et al. |
| 7,834,538 B2 | 11/2010 | Yamazaki et al. |
| 8,054,450 B2 | 11/2011 | Peckerar et al. |
| 8,282,089 B2 | 10/2012 | Heimel et al. |
| 8,361,230 B2 | 1/2013 | Manz |
| 8,427,253 B2 | 4/2013 | Satake et al. |
| 8,559,159 B2 | 10/2013 | Roy et al. |
| 8,617,314 B2 | 12/2013 | An et al. |
| 8,686,819 B2 | 4/2014 | Schuessler et al. |
| 8,817,376 B2 | 8/2014 | Lee et al. |
| 8,891,152 B2 | 11/2014 | Fike, III et al. |
| 8,912,712 B2 | 12/2014 | Yamazaki et al. |
| 9,013,795 B2 | 4/2015 | Lee et al. |
| 9,045,818 B2 | 6/2015 | Gersdorff et al. |
| 9,176,318 B2 | 11/2015 | Hagood et al. |
| 9,229,222 B2 | 1/2016 | Hagood et al. |
| 9,274,333 B2 | 3/2016 | Hagood, IV et al. |
| 9,463,543 B2 | 10/2016 | White et al. |
| 9,490,153 B2 | 11/2016 | Webb et al. |
| 9,922,854 B2 | 3/2018 | Kurita et al. |
| 10,070,520 B2 | 9/2018 | Tomita et al. |
| 10,077,207 B2 | 9/2018 | Lee et al. |
| 2004/0123952 A1 | 7/2004 | Hur et al. |
| 2004/0238048 A1 | 12/2004 | Mikiya et al. |
| 2007/0006807 A1 | 1/2007 | Manz |
| 2007/0009671 A1 | 1/2007 | Manz |
| 2009/0075411 A1 | 3/2009 | Yamazaki et al. |
| 2009/0258142 A1 | 10/2009 | An et al. |
| 2011/0131792 A1 | 6/2011 | Kwak et al. |
| 2012/0033340 A1 | 2/2012 | Roy et al. |
| 2012/0103255 A1* | 5/2012 | Fukuda .................. C23C 14/54 118/668 |
| 2012/0183676 A1* | 7/2012 | Sonoda ................. C23C 14/042 427/8 |
| 2012/0237682 A1* | 9/2012 | Hong .................... C23C 14/042 427/282 |
| 2013/0135741 A1 | 5/2013 | Lee et al. |
| 2015/0026953 A1 | 1/2015 | Webb et al. |
| 2015/0228517 A1 | 8/2015 | Toc et al. |
| 2018/0308710 A1 | 10/2018 | Chan et al. |
| 2018/0376591 A1 | 12/2018 | Tomita et al. |
| 2019/0010083 A1 | 1/2019 | Lee et al. |
| 2019/0013229 A1* | 1/2019 | Cho .................. H01L 21/68742 |
| 2019/0144988 A1 | 5/2019 | Mizumura |

FOREIGN PATENT DOCUMENTS

| | | |
|---|---|---|
| CN | 102482760 A | 5/2012 |
| CN | 103282540 B | 2/2015 |
| CN | 109554662 A | 4/2019 |
| EP | 470541 B1 | 10/1995 |
| JP | H1055944 A | 2/1998 |
| JP | 2004176124 A | 6/2004 |
| JP | 2009076227 A | 4/2009 |
| JP | 4809288 B2 | 11/2011 |
| JP | 2012049326 A | 3/2012 |
| JP | 2012104393 A | 5/2012 |
| JP | 2013209700 A | 10/2013 |
| JP | 2013209710 A | 10/2013 |
| JP | 2013211139 A | 10/2013 |
| JP | 5570939 B2 | 8/2014 |
| JP | 2017057485 A | 3/2017 |
| JP | 2018003142 A | 1/2018 |
| JP | 2018003151 A | 1/2018 |
| JP | 6393802 B1 | 9/2018 |
| JP | 6448067 B2 | 1/2019 |
| JP | 6461235 B2 | 1/2019 |
| JP | 6468540 B2 | 2/2019 |
| JP | 2019039072 A | 3/2019 |
| JP | 2019083311 A | 5/2019 |
| KR | 101322530 B1 | 10/2013 |
| KR | 20150092421 A | 8/2015 |
| KR | 20160101263 A | 8/2016 |
| KR | 101979149 B1 | 5/2019 |
| WO | 1990004320 A2 | 4/1990 |
| WO | 2012053402 A1 | 4/2012 |
| WO | 2014112512 A1 | 7/2014 |
| WO | 2014114360 A1 | 7/2014 |
| WO | 2017222009 A1 | 12/2017 |
| WO | 2018153480 A1 | 8/2018 |
| WO | 2018153481 A1 | 8/2018 |
| WO | 2018166636 A1 | 9/2018 |
| WO | 2019020166 A1 | 1/2019 |
| WO | 2019091561 A1 | 5/2019 |
| WO | 2019101319 A1 | 5/2019 |
| WO | 2019114806 A1 | 6/2019 |

OTHER PUBLICATIONS

International Search Report and Written Opinion Application No. PCT/2020/028046 dated Jul. 31, 2020 consists of 12 pages.

* cited by examiner

METHOD FOR MASK AND SUBSTRATE ALIGNMENT

CROSS-REFERENCE TO RELATED APPLICATIONS

This application claims benefit to U.S. Appl. No. 62/878,469, filed on Jul. 25, 2019, and U.S. Appl. No. 62/852,748, filed on May 24, 2019, which are herein incorporated by reference.

BACKGROUND

Field

Embodiments of the present disclosure generally relate to fabrication processes and related systems and apparatuses, and in particular to processes for aligning a mask with a substrate and related systems and apparatuses.

Description of the Related Art

Generating a semiconductor device typically includes depositing multiple layers of different materials on a substrate (or wafer). In many instances, the layers are deposited through a blanket deposition over the entire substrate. The substrate can then be patterned by a lithography (or similar) process. Further, any extra material can be subsequently removed by an etch process or any other suitable material removal process. However, etching various films, for example organic films, is difficult and time intensive. Further, the process of depositing one or more layers is time intensive and the patterning processes, such as lithography, are expensive. Contrary to the above described processes, in various instances, a mask can be positioned over a substrate during the deposition process, controlling which areas of the substrate receive the deposited material, reducing the number of process steps. For example, using a mask during the deposition process can make expensive process steps, such as lithography and etching, unnecessary. However, as the placement of the mask relative to the substrate controls which areas of the substrate receive the deposited material, it is important that the placement of the mask is done with high accuracy. Further, if there is more than one layer deposited through the masks, accurate alignment is even more important.

Thus, there is a need for methods for aligning masks with substrates, as well as mask alignment modules that are able to house and accurately position masks on a substrate for processing.

SUMMARY

Embodiments of the present disclosure generally relate to methods for aligning masks with substrates and related systems and apparatuses. In one or more embodiments, a method for aligning a mask with a substrate includes receiving a carrier having a substrate disposed on a surface of the carrier at an alignment stage of an alignment module, transferring, via a transfer robot, a mask from a mask cassette of a mask stocker of the alignment module to a position over the alignment stage, and positioning the mask on the carrier.

In other embodiments, a method for aligning a mask with a substrate includes receiving a carrier having a substrate disposed on a surface of the carrier at an alignment stage of an alignment module, transferring a mask from a mask cassette of a mask stocker of the alignment module to a position over the alignment stage, and positioning the mask on the carrier. The method also includes acquiring one or more images of the mask and the substrate, where the mask contains one or more alignment holes passing through the mask and the substrate contains one or more alignment dots disposed on an upper surface of the substrate, analyzing the one or more images to determine one or more differences between one or more alignment holes of the mask and one or more alignment dots on the substrate, and aligning the mask with the substrate based on the one or more differences.

In some embodiments, a method for aligning a mask with a substrate includes receiving a carrier having a substrate disposed on a surface of the carrier at an alignment stage of an alignment module, transferring, via a transfer robot, a mask from a mask cassette of a mask stocker of the alignment module to a position over the alignment stage, and positioning the mask on the carrier by moving the alignment stage vertically toward the transfer robot to position the mask on the carrier. The method also includes acquiring one or more images of the mask and the substrate, analyzing the one or more images to determine one or more differences between one or more alignment elements of the mask and one or more alignment elements on the substrate, and aligning the mask with the substrate based on the one or more differences by moving the alignment stage to adjust a position of the substrate with respect to the mask.

In one or more embodiments, an alignment module for aligning a mask with a substrate contains a mask stocker configured house a mask cassette configured to store a plurality of masks, an alignment stage configured to support a carrier and a substrate, a transfer robot configured to transfer a mask of the plurality of masks from the mask stocker to the alignment stage and position the mask over the substrate, and a controller configured to control the system to conduct, perform, or execute any of the methods described and discussed herein.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
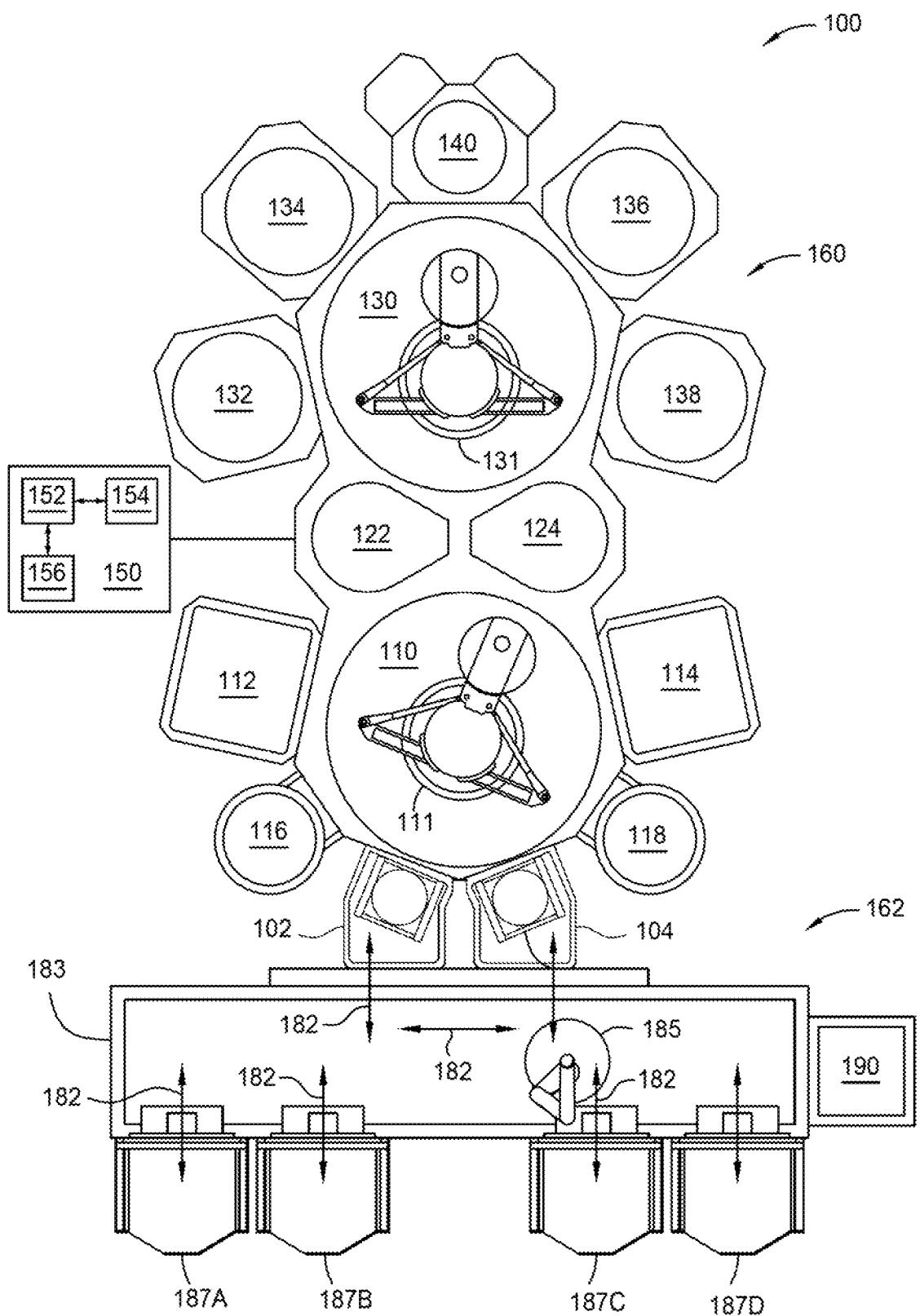
FIG. 1 depicts a schematic illustration of an integrated platform, according to one or more embodiments described and discussed herein.

To facilitate understanding, identical reference numerals have been used, where possible, to designate identical elements that are common to the Figures. It is contemplated that elements and features of one or more embodiments may be beneficially incorporated in other embodiments without specific recitation thereof with respect thereto.

DETAILED DESCRIPTION

Masks are commonly used during the processing of a substrate to control the alignment and placement of a deposited material on the surface of the substrate and/or etching material from one or more surfaces of the substrate. For example, a mask can be positioned over a substrate to control which areas of the surface of the substrate will receive a deposited material. Further, multiple layers of different materials can be deposited onto each substrate to generate an electronic device, with each layer utilizing a different mask. Thus, any misalignment between any of the masks and the substrate in different deposition processes or etching processes can render the corresponding electronic device unusable. In the following disclosure, an improved mask alignment chamber that both houses and accurately positions a mask on a substrate for use in a subsequent processing step is described. While the disclosure herein primarily discusses the use of the a mask in a deposition process this configuration is not intended to be limiting as to the scope of the disclosure provided herein since the apparatus and methods described herein could also be used for other substrate processing steps, such as etching steps, material doping or implant steps, thermal processing steps or other useful processing steps.

FIG. 1 depicts an integrated platform 100 for processing a substrate, according to one or more embodiments described and discussed herein. For example, the integrated platform 100 can deposit one or more metal layers and/or organic materials on a substrate to fabricate a light sensing device. For example, the light sensing device can be an organic image sensing device. An example of an integrated platform including multiple process chambers includes the ENDURA® platform, commercially available from Applied Materials, Inc. of Santa Clara, Calif. Alternatively, other substrate processing platforms can be also be modified in accordance with the present disclosure.

The integrated platform 100 can include a vacuum-tight processing platform 160, a factory interface 162, and a controller 150. Further, the integrated platform 100 can also be referred to as a cluster tool or multi-chamber processing system.

The processing platform 160 includes one or more process chambers. For example, the processing platform 160 can include process chambers 112, 114, 116, 118, 132, 134, 136, and 138 and an alignment module 140. Further, the processing platform 160 includes one or more transfer chambers. For example, as is illustrated in FIG. 1, the processing platform 160 includes transfer chambers 110 and 130. The processing platform 160 can also include one or more pass through chambers that allow a substrate to be transferred between transfer chambers. For example, the pass through chambers 122, 124 can allow a substrate to be transferred between the transfer chambers 110 and 130.

The processing platform 160 can also include one or more load lock chambers. For example, as is illustrated in FIG. 1, the processing platform 160 includes load lock chambers 102, 104. The load lock chambers 102, 104 can be pumped down to be operated under a vacuum before transferring substrates from the factory interface 162 and the transfer chamber 110.

The factory interface 162 includes one or more docking stations 183, one or more factory interface robots 185, and a substrate carrier chamber 190. The docking stations 183 include one or more front opening unified pods (FOUPS) 187A-187D. The factory interface robot 185 can be capable of linear and rotational movement illustrated by arrows 182. Further, the factory interface robot 185 can transfer substrates between the FOUPS 187, the load lock chambers 102, 104 and the substrate carrier chamber 190. The substrate carrier chamber 190 can be configured to mount the substrate on a carrier (e.g., a chuck) or remove the substrate from the carrier. For example, a carrier can include one or more conductive elements (e.g., chucking electrodes) configured to electrostatically hold the substrate against the carrier. The carrier and substrate can be transferred by the factory interface robot 185 from the substrate carrier chamber 190 to one or more of the load lock chambers 102, 104. Additionally, the carrier and a processed substrate can be transferred from the load lock chambers 102, 104 to the substrate carrier chamber 190 such that the processed substrate can be removed from the carrier, and the processed substrate can be transferred from the substrate carrier chamber 190 to one of the FOUPS 187 by the factory interface robot 185.

The transfer chamber 110 includes a transfer robot 111. The transfer robot 111 transfers substrates to and from the load lock chambers 102, 104, to and from the process chambers 112, 114, 116, and 118, and to and from pass through chambers 122, 124. The pass-through chambers 122 and 124 can be utilized to maintain vacuum conditions while allowing substrates to be transferred within the integrated platform 100 between transfer chambers 110 and 130. The transfer robot 131 transfers substrates between the pass-through chambers 122, 124 and the process chambers 132, 134, 136, and 138 and the alignment module 140, and between the process chambers 132, 134, 136, and 138 and the alignment module 140.

The process chambers 112, 114, 116, 118, 132, 134, 136, and 138 and the alignment module 140 can be configured in any manner suitable to process a substrate. For example, the process chambers 112, 114, 116, 118, 132, 134, 136, and 138 can be configured to deposit one or more metal layers, one or more organic films and apply one or more cleaning processes to a substrate to create a semiconductor device such as a light sensing device, or the like. In other examples, the alignment module 140 can be configured to align together a substrate and a mask.

A first one or more of the process chambers, e.g., the process chambers 116, 118, are configured to perform a pre-cleaning process to eliminate contaminants and/or degas volatile components from a substrate prior to transferring the substrate into another process chamber. The process chambers 114 and 112 can be configured to deposit one or more metal layers on a substrate. The process chamber 138 can be configured to deposit one or more layers of indium tin oxide (ITO) material on a substrate. The process chambers 132, 134 and 136 can be configured to deposit one or more organic films on a substrate. Further, the alignment module 140 can be configured to position a mask (e.g., a shadow mask) on a substrate before the substrate is transferred to one or more the process chambers 132, 134, 136 and 138 and unload a mask from a substrate after processing within one or more of the process chambers 132, 134, 136, and 138. The process chambers 116, 118, 132, 134, 136, and 138 can be configured to deposit materials (e.g., metal layers or organic films) using a chemical deposition process such as chemical vapor deposition (CVD), atomic layer deposition (ALD), metalorganic chemical vapor deposition (MOCVD), plasma-enhanced chemical vapor deposition (PECVD), and physical vapor deposition (PVD) (e.g., sputtering process or evaporation process), among others.

The controller 150 is configured to control the components of the integrated platform 100. The controller 150 can be any suitable controller for controlling the operation one or more of the process chambers, the transfer chambers, pass through chambers, and the factory interface. For example, the controller 150 can be configured to control the operation of transfer robot 111 and/or the transfer robot 131. The controller 150 includes a central processing unit (CPU) 152, a memory 154, and support circuits 156. The CPU 152 can be any general purpose computer processor that can be utilized in an industrial environment. The support circuits 156 are coupled to the CPU 152 and can include cache, clock circuits, input/output subsystems, power supplies and the like. Software routines can be stored within the memory 154. The software routines can be executed by the CPU 152 and thus be adapted to cause various components within the integrated platform 100 to perform one or more of the methods described herein. Alternatively, or additionally, one or more of the software routines can be executed by a second CPU not illustrated. The second CPU can be part of the controller 150 or remote from the controller 150.

One or more process chambers, one or more transfer chambers, one or more pass through chambers, and/or the factory interface can have a dedicated controller or controllers (e.g., the controller 270 of FIG. 2) configured to control at least a portion of the methods disclosed herein. The dedicated controllers can be configured similar to as the controller 150 and can be coupled with the controller 150 to synchronize processing of a substrate within the integrated platform 100.

Figure 2:
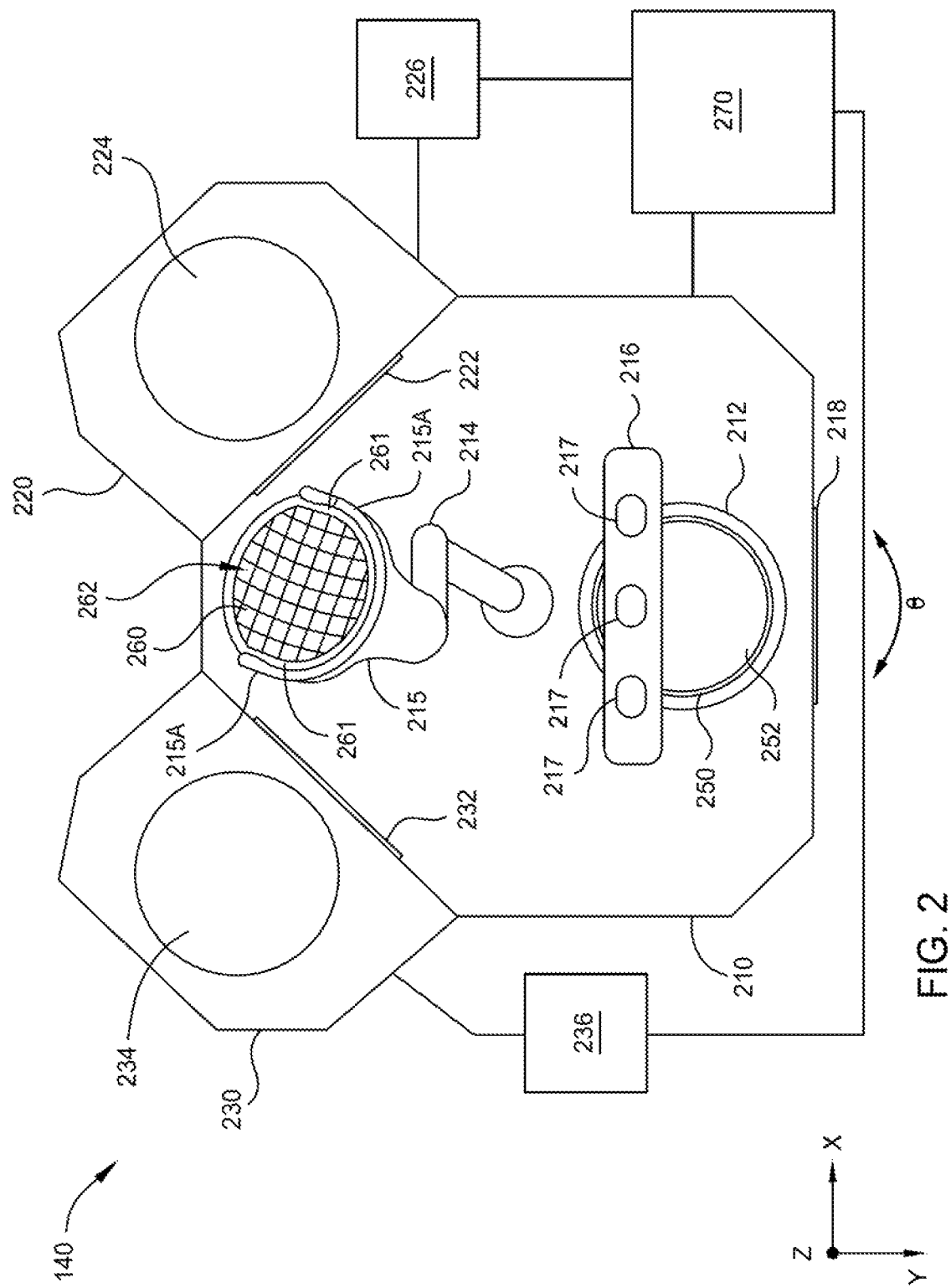
FIG. 2 depicts a schematic illustration of an alignment module, according to one or more embodiments described and discussed herein.

FIG. 2 is a schematic illustration of the alignment module 140, according to one or more embodiments described and discussed herein. The alignment module 140 can include an alignment chamber 210 and a mask stocker 220. Additionally, the alignment module 140 can include a second mask stocker, e.g., the mask stocker 230.

Additionally, the alignment chamber 210 can include an alignment stage 212, a transfer robot 214, an alignment system 216, and a valve assembly 218. The valve assembly 218 can be configured to isolate the interior volume of the alignment module 140 from a transfer chamber, e.g., the transfer chamber 130, of the processing platform 160. The valve assembly 218 can include a conventional slit valve or gate valve that is configured to isolate one region or volume from another by opening, closing or obstructing a port or passageway formed between the adjoining regions or volumes. Additionally, the valve assembly 218 can be configured to allow a carrier 250 carrying (or supporting) a substrate 252 to be transferred into and out of the alignment module 140. The valve assembly 218 can be any valve assembly used to separate, or isolate, the alignment module 140 from the processing platform 160. Further, the valve assembly 218 can aid in limiting or eliminating cross-talk and cross contamination between the alignment module 140 and the processing platform 160 each time a substrate is loaded into or transferred out of the alignment module 140. Additionally, the valve assembly 218 opens to allow movement of the transfer robot 131, 111 and a substrate and carrier into and out of the alignment module 140. Further, the pressure within the transfer chamber 130 can be little higher than that of the alignment module 140 or any other process chamber. The difference in pressure can protect the process chamber from flow influx.

The alignment stage 212 is configured to hold the carrier 250 and substrate 252 while a mask, e.g., mask 260, is positioned over the substrate 252 or removed from the substrate 252. The alignment stage 212 can move in one or more directions (an X-direction, a Y-direction, a Z-direction, and/or a θ-direction) to position and align the substrate 252 with the mask 260.

The mask 260 can be positioned over the substrate 252 such that there is a uniform distance between the mask 260 and the substrate 252 across the surface of the substrate 252. The mask 260 can rest on one or more flexure elements disposed within or on the carrier 250, or within or on a surface of the mask 260. The flexure elements can deform under the weight of the mask 260 and restrict lateral movement of the mask 260.

The masks 260 can have a plurality of openings 262 which form a die pattern. Each opening 262 can have any shape, size, or dimension. For example, each opening 262 can have a rectangular geometry with a length and a width independently in a range of about 3 µm to about 50 mm, such as about 1 mm to about 40 mm. In other examples, each opening 262 can have a circular or rounded geometry with a diameter in a range of about 3 µm to about 50 mm, such as about 1 mm to about 40 mm. Alternatively, the mask 260 can have one or more openings 262 that have a feature dimension (e.g., width, length, and/or diameter) that is greater than 50 mm.

The masks 260 can have a thickness over the surface of a substrate of about 3 µm to about 200 µm. Alternatively, in other embodiments, the masks 260 can have a thickness of less than 3 µm or greater than 200 µm. The frame of the mask (e.g., region outside of the diameter of a substrate) may have a thickness that is about 3 mm and about 10 mm, and a cross section that is about 3 mm and about 10 mm. Alternatively, in other embodiments, the frame of the masks can have a thickness and cross section of less than 3 mm or greater than 10 mm. The masks 260 can contain or be formed from an invariable material, e.g., invar. For example, the masks 260 can contain or be formed from nickel, nickel alloys, or the like. In some embodiments, a diameter of the masks can be larger than the diameter of the substrates and/or larger than the diameter of the carriers.

Figure 3:
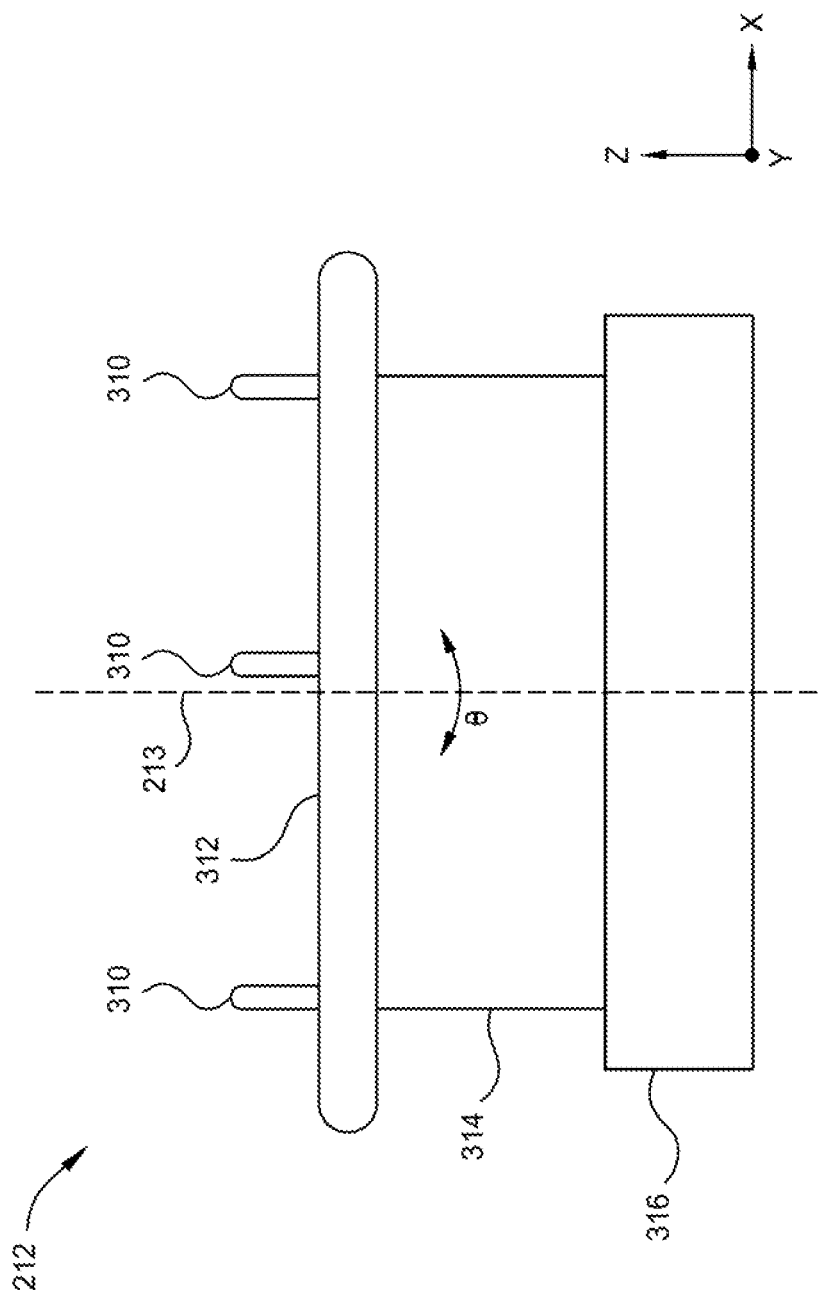
FIG. 3 depicts a schematic illustration of an alignment stage, according to one or more embodiments described and discussed herein.

FIG. 3 is a schematic illustration of a cross-section of the alignment stage 212, according to one or more embodiments described and discussed herein. The alignment stage 212 includes loading pins 310, an alignment surface 312, an alignment mechanism 314, and a base 316. The loading pins 310 are configured to guide and align the carrier 250 onto the alignment stage 212 and aid in the removal of the carrier 250 from the alignment stage 212. For example, the carrier 250 carrying the substrate 252 can be loaded onto the loading pins 310, and the loading pins 310 can be retracted such that the carrier 250 is moved toward to the alignment surface 312. Additionally, the loading pins 310 can be retracted until the carrier 250 contacts and rests on the alignment surface 312.

The alignment mechanism 314 can include one or more actuators configured to move the alignment surface 312 in one or more directions, such as an X-direction, a Y-direction, a Z-direction, and/or theta (θ) (rotation about the Z-axis). For example, the alignment mechanism 314 can be configured to move the alignment surface 312 at least about 2 mm in the X-direction or the Y-direction to align the carrier 250 and the substrate 252 with the mask 260. Further, the alignment mechanism 314 can move the alignment surface 312 at least about 2 degrees of rotation in the θ-direction about a centralized axis 213 of the alignment stage 212 extending along the Z-direction, as depicted in FIG. 3. The alignment mechanism 314 can move the alignment surface in the Z-direction to bring the substrate 252 into the field of focus (e.g., close to the mask) of the alignment system 216 and move the carrier 250 and substrate 252 to receive the mask 261 from the transfer robot 214. Alternatively, the loading pins 310 can be utilized to move the carrier 250 and substrate 252 in the Z-direction (e.g., vertical direction) to receive the mask 260.

The alignment mechanism 314 can receive instructions according to images captured by the alignment system 216 to move the substrate 252 in one or more of an X-direction, Y-direction, or a θ-direction to align the mask 260 with the substrate 252. Further, the alignment mechanism 314 can move the carrier 250 and the substrate 252 in a Z-direction (e.g., vertical direction) away from the base 316 and toward the transfer robot 214 to engage with and receive the mask 260 and in a Z-direction toward the base and away from the transfer robot 214 to disengage the mask 260 from the carrier 250 and the substrate 252.

With further reference to FIG. 2, the alignment system 216 is configured to aid in the alignment of the mask 260 with the substrate 252 and/or carrier 250. The alignment system 216 can include one or more cameras 217 configured to capture images of the mask 260, the carrier 250 and/or the substrate 252. The alignment system 216 can have a depth of focus of about 100 μm to about 2,000 μm. Alternatively, the alignment system 216 can have a depth of focus of less than 100 μm or greater than 2,000 μm. The cameras 217 can be configured to acquire one or more images of the mask 260, the carrier 250, and/or the substrate 252. The images can be analyzed to determine a difference in alignment between the mask 260 and the substrate 252. Analyzing the images can include comparing the position of one or more alignment elements (e.g., fiducial markers) of the mask 260 with corresponding alignment elements (e.g., fiducial markers) of the substrate 252 or the carrier 250. For example, the alignment elements of the masks can be holes and the alignment elements of the substrate can be any type of marking that is viewable through the holes of the masks. The alignment elements within the masks 260 can be any shape and/or size and can be positioned at specified locations on the masks 260. The alignment elements within the masks 260 can be or include holes, edges, corners, strips, strip crossings, and/or the like. The alignment elements within the substrates 252 can be any shape and/or size and can be positioned at specified locations on the substrates 252. The alignment elements within the substrates 252 can be or include dots, patterns, lines, edges, corners, and/or the like.

The locations of the alignment elements within the masks 260 can be known by the controller 270 and/or the alignment system 216. The cameras 217 can be configured to acquire an image of the alignment of the elements of the substrate 252 through alignment elements (e.g., holes) of the mask 260. The images can be provided to the controller 270 which determines the difference between the alignment elements on the mask 260 and the alignment elements of the substrate 252 or carrier 250. Further, the controller 270 determines the direction or directions and the amount to move the substrate 252 and carrier 250 to align the substrate 252 with the mask 260. For example, the controller 270 can determine the direction or directions and the amount to move the substrate 252 to align the alignment elements of the substrate 252 with a center of a respective one of the alignment elements (e.g., holes) of the mask 260. The direction and amount to move the substrate 252 is communicated to one or more of the actuators of the alignment mechanism 314 of the alignment stage 212 from the controller 270 as a set of instructions.

The transfer robot 214 is configured to transfer masks between the mask stockers 220, 230 and the alignment stage 212. The transfer robot 214 can be controlled by the controller 270. The transfer robot 214 can include blade 215 configured to support a mask, e.g., the mask 260, along edges of the mask. For example, the blade 215 can include two or more fingers configured to catch along first and second parallel edges of the mask 260. The first and second parallel edges of the mask 260 can include portions that are substantially flat.

The transfer robot 214 can receive instructions from the controller 270 instructing the transfer robot 214 to access a first mask stocker, e.g., mask stocker 220, to acquire a mask, e.g., the mask 260, and position the mask 260 over the surface of the substrate 252 and carrier 250. Further, the transfer robot 214 can receive instructions from the controller 270 to remove the mask 260 from a position over the substrate 252 and the carrier 250 and transfer the mask 260 to one of the mask stockers 220, 230. The transfer robot 214 can also transfer masks 260 between the mask stockers 220, 230. Further, the transfer robot 214 can be configured to position the mask 260 over the substrate 252 within one or more predetermined distances of an aligned position between the mask 260 and the substrate 252, as is further described and discussed below. Alternatively, the transfer robot 214 can be configured to position the mask 260 over the substrate 252 within a distance that is less than or greater than 0.5 mm of an aligned position between the mask 260 and the substrate 252.

The transfer robot 214 can hold the mask 260 in a stationary position over the alignment stage 212. The transfer robot 214 can hold the mask 260 in a stationary position as determined by the alignment system 216. Further, the transfer robot 214 can hold the mask 260 in a stationary position while the alignment stage 212 is moved based on images acquired by the alignment system 216 to align the substrate 252 with the mask 260.

Figure 4:
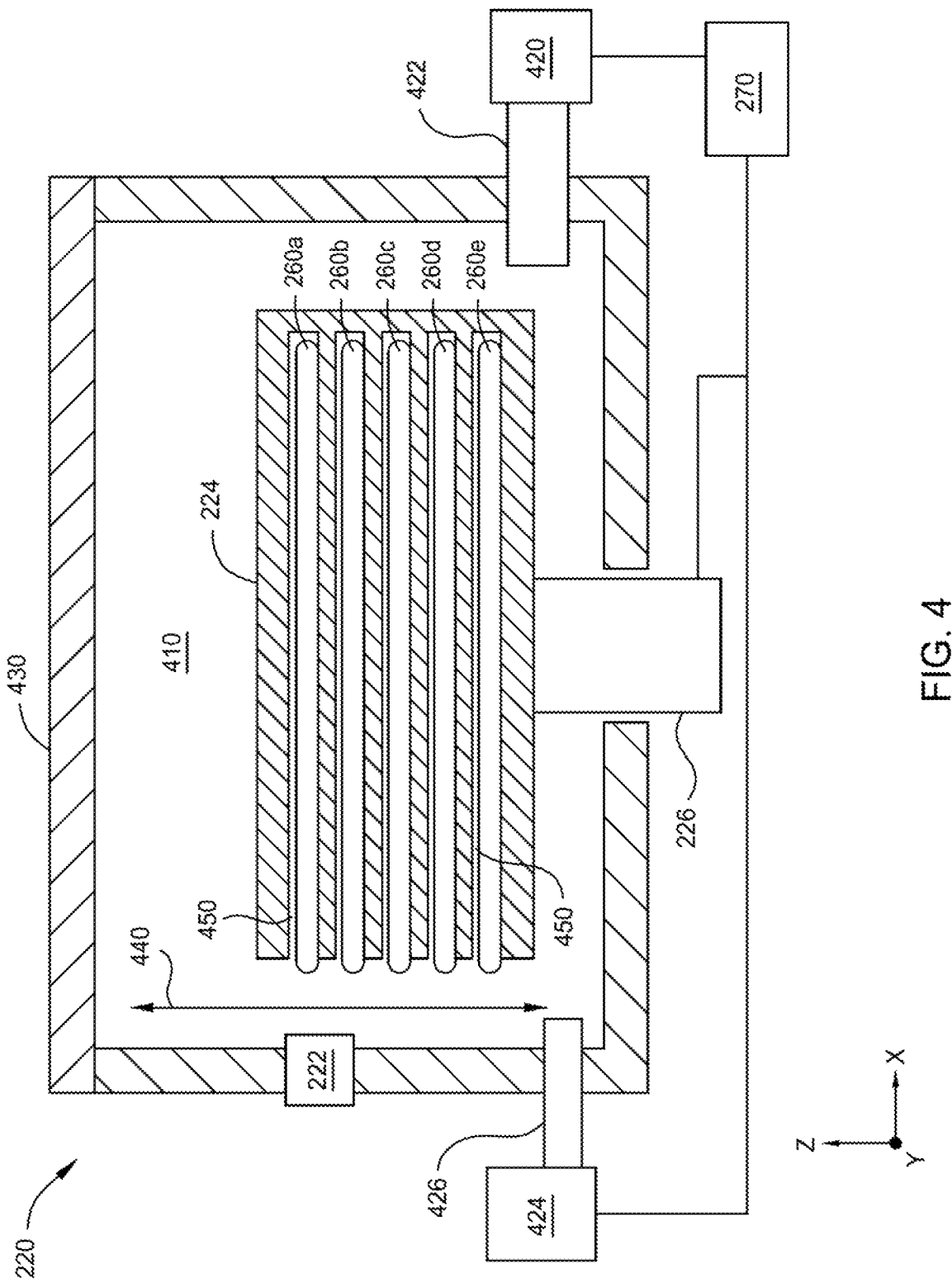
FIG. 4 depicts a schematic illustration of a cross-section of a mask stocker, according to one or more embodiments described and discussed herein.

The mask stocker 220 includes a slit valve assembly 222, which is similar to the valve assembly 218, to isolate the interior volume of the mask stocker 220 from the interior volume of the alignment chamber 210. Further, as shown in FIG. 4, the mask stocker 220 houses a mask cassette 224. A vertical actuator 226 is configured to move the mask cassette 224 in a vertical direction to align a selected mask with the slit valve assembly 222 such that it can be accessed by the transfer robot 214. Further, the vertical actuator 226 can move the mask cassette 224 in a vertical direction to align an empty slot of the mask cassette 224 with the slit valve assembly 222 such that a mask can be transferred to the mask cassette 224 by the transfer robot 214.

The mask stocker 230 can be configured similarly to that of mask stocker 220. For example, the mask stocker 230 can include a slit valve assembly 232, a mask cassette 234 and a vertical actuator 236, each configured similarly to that of the slit valve assembly 222, the mask cassette 224 and the vertical actuator 226, respectively.

Both of the mask stockers 220 and 230 can house a plurality of masks which can be used during a deposition process. Further, the mask stocker 220 can house masks of a first type and the mask stocker 230 can house masks of a second type. For example, the mask stocker 220 can house masks utilized during the deposition of organic materials and the mask stocker 230 can house masks utilized during the deposition of metal layers. Additionally, or alternatively, at least one of the mask stockers 220 and 230 can house masks of various types. For example, at least one of the mask stockers 220 and 230 can house masks of a first type corresponding to the deposition of organic materials and masks of a second type corresponding to the deposition of metal layers. Further, the mask stocker 220 and/or the mask stocker 230 can house masks of a third type. At least one of the mask stockers 220 and 230 can house a number of masks of a first type and a number of masks of a second type. The number of masks of the first type can be equal to, less than or greater than the number of masks of the second type. Further, the mask stocker 220 can be controlled independently from the mask stocker 230.

Alternatively, the mask stocker 220 can house one or more masks which can be used during a deposition process, and the mask stocker 230 can house one or more masks to be cleaned. For example, the transfer robot 214 can move masks that have been identified as being ready to be cleaned from the mask stocker 220 to the mask stocker 230 or from the alignment stage 212 to the mask stocker 230.

The mask stocker 220 and the mask stocker 230 can maintain isolation between each other and the alignment chamber 210 of the alignment module 140 and between corresponding masks and an ambient environment. Isolating the masks from the ambient environment aids in the prevention of oxidation and moisture absorption on the masks. Further, as each of the mask stockers 220, 230 are isolated from each other and from the alignment chamber 210, each of the mask stockers 220, 230 can be operated independently. For example, one or more of the mask stockers 220, 230 can be vented while operation of the alignment module 140 and the processing platform 160 can be continued. A mask stocker 220, 230 can be vented to allow access to the corresponding mask cassette and masks. Further, when a mask cassette, e.g., the mask cassette 224, is placed within a mask stocker, e.g., mask stocker 220, 230, the mask stocker is pumped down to a vacuum by a vacuum pump, e.g., the vacuum pump 420. After the mask stocker is pumped down, the corresponding valve assembly, e.g., the slit valve assembly 222, 232, can be opened to connect the mask stocker to the alignment chamber for processing.

FIG. 4 depicts a cross-sectional view of the mask stocker 220, according to one or more embodiments described and discussed herein. The mask stocker 220 includes an interior volume 410 in which the mask cassette 224 can be positioned. The mask cassette 224 is coupled to vertical actuator 226, and the vertical actuator 226 is configured to move the mask cassette 224 along path 440 to align a selected one of the masks 260a-260d or slots 450 with the slit valve assembly 222. As illustrated in FIG. 4, the mask cassette 224 is configured to hold 5 masks, e.g., the masks 260a-260d. Alternatively, the mask cassette 224 can be configured to hold less than 5 masks or more than 5 masks. The mask stocker 220 can also include a lid 430 which can be opened to gain access to the interior volume 410. For example, the lid 430 can be opened to remove the mask cassette 224 and/or one or more masks 260 from the mask stocker 220. Further, the lid 430 can be opened such that a mask cassette 224 can be loaded into the mask stocker 220. The vertical actuator 226 can move the mask cassette 224 to an unloading position when the lid 430 is opened to allow the mask cassette 224 to be removed from the mask stocker 220. Placing the mask cassette 224 into an unloading position can include moving the mask cassette 224 in a vertical direction toward the lid 430. Further, the vertical actuator 226 can be positioned into a loading position to receive the mask cassette 224 when the lid 430 is opened to receive a mask cassette 224 to be loaded into the mask stocker 220. The vertical actuator 226 lowers the mask cassette 224 into the interior volume 410 and the lid 430 can be closed.

The mask stocker 220 can also include gas supply source 424 that is configured to provide one or more gases to the interior volume 410 via gas inlet 426. The gas supply source 424 can be configured to pump one or more gases into the interior volume 410 to increase the pressure of the interior volume. Additionally, the mask stocker 220 can include a vacuum pump 420 and a gas outlet 422. The vacuum pump 420 can be configured to remove gas from the interior volume 410 to reduce the pressure of the interior volume 410. For example, the vacuum pump 420 can exhaust one or more gases from the interior volume 410 to place the interior volume 410 at or near vacuum.

The controller 270 can be electrically coupled to the vertical actuator 226, the gas supply source 424 and the vacuum pump 420. Further, the controller 270 can control the vertical actuator 226 to move the mask cassette 224 along the path 440, the gas supply source 424 to input a gas into the interior volume 410, and/or the vacuum pump 420 to remove gas from the interior volume 410. For example, the controller 270 can include a scheduler configured to control the vertical actuator 226. The scheduler can instruct the vertical actuator 226 to the move the mask cassette 224 along path 440 to align a selected mask to be transferred out of the mask stocker 230. A mask can be selected based on next deposition process for the substrate 252. For example, the scheduler of the controller 270 can have information corresponding to the entire deposition process and select masks according to the deposition process. Additionally, the controller 270 can be configured similar to that of the controller 150 or form part of the controller 150.

Figure 5A:
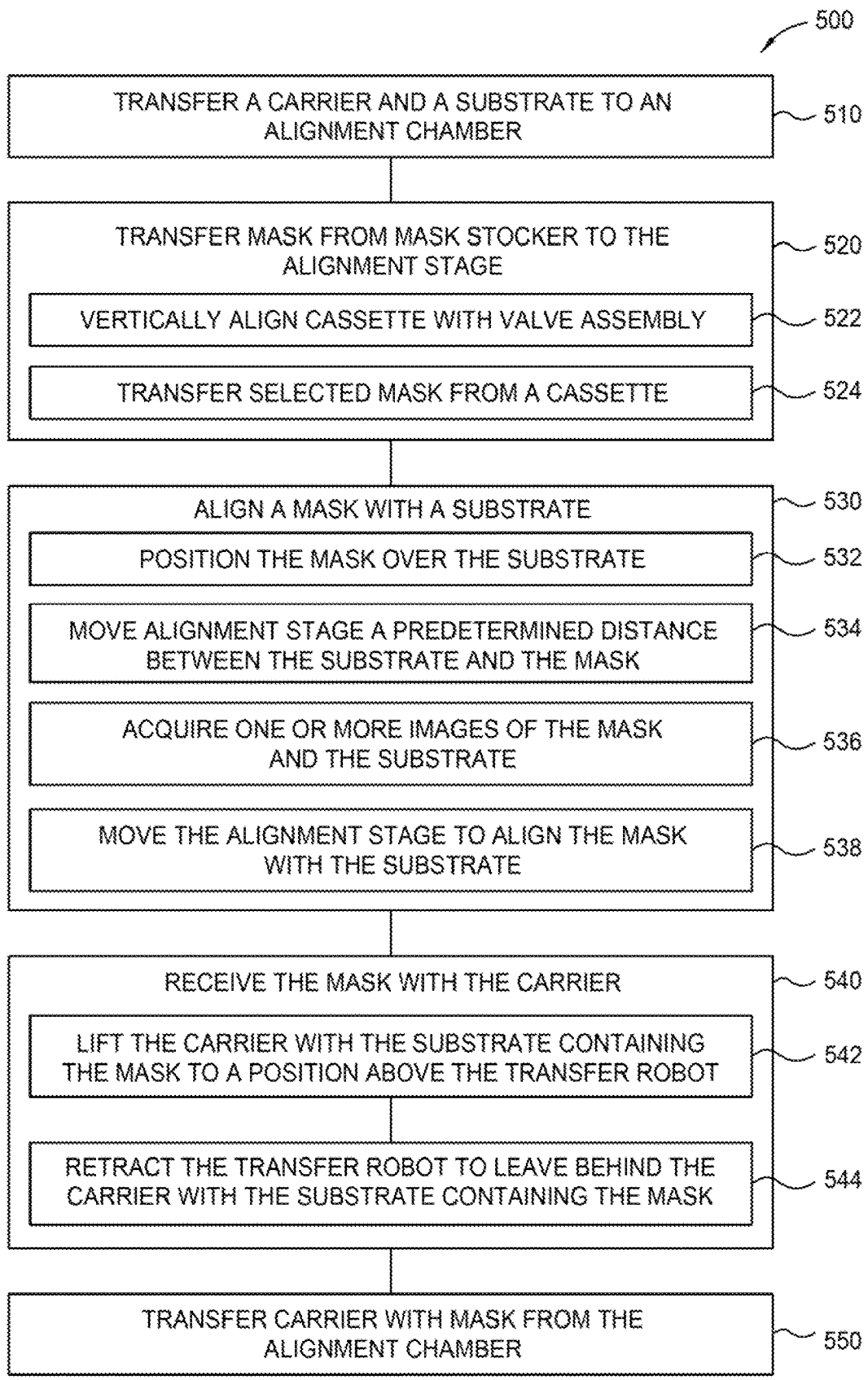
FIG. 5A depicts a flow chart of a method for positioning a mask over a substrate, according to one or more embodiments described and discussed herein.
Figure 5B:
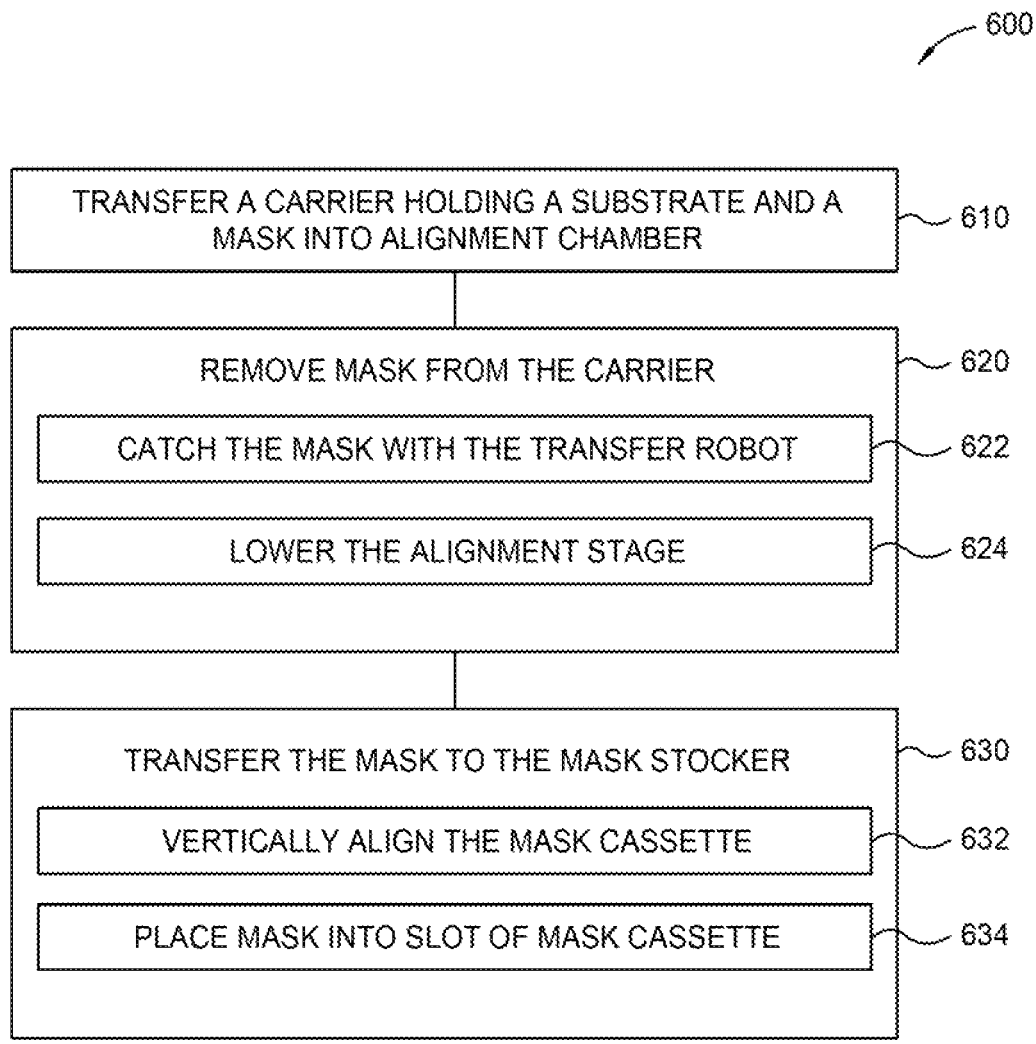
FIG. 5B depicts a flow chart of a method for removing a mask from a substrate, according to one or more embodiments described and discussed herein.

FIGS. 5A and 5B depict flow charts of methods for respectively applying and removing a mask to and from a substrate. FIG. 5A depicts a flow chart of a method 500 for applying a mask to a substrate which includes loading the mask on a carrier and positioning the mask over the substrate, according to one or more embodiments described and discussed herein. At operation 510, a carrier 250 carrying a substrate 252 is transferred to an alignment module 140. For example, the transfer robot 131 transfers the carrier 250 and the substrate 252 to the alignment module 140. The transfer robot 131 can transfer the carrier 250 and the substrate 252 from one of the pass through chambers 122, 124 or one of the process chambers 132, 134, 136, and 138. The transfer robot 131 can pass the carrier 250 and the substrate 252 through the valve assembly 218 into the alignment module 140. Further, the carrier 250 can be positioned on the loading pins 310 of the alignment stage 212 and lowered into position on the alignment surface 312 by the alignment mechanism 314.

At operation 520, a mask is transferred from a mask stocker 220 to the alignment stage 212. For example, the controller 270 can instruct the transfer robot 214 to transfer the mask 260 from the mask stocker 220 or the mask stocker 230 to the alignment stage 212 and position the mask 260 over the substrate 252. Further, during this operation, a mask cassette is vertically moved to align with a mask slot lifted over the robot transfer plane (operation 522). In some examples, the controller 270 can instruct the vertical actuator 226 to move the mask cassette 224 vertically along the path 440 to align a selected one of the masks 260 with the slit valve assembly 222. At operation 524, a transfer robot transfers a selected mask from a mask cassette. For example, the controller 270 can instruct the transfer robot 214 to access the mask cassette 224 of the mask stocker 220 and transfer a selected mask from the mask cassette 224 to the blade 215. During this operation, the blade 215 of the transfer robot 214 is inserted along the edges of a selected mask, e.g., the mask 260b, and the transfer robot 214 removes the selected mask from the mask stocker 220 through the slit valve assembly 222.

In one or more examples at operation 520, the mask cassette 224 is vertically aligned with the mask slot and lifted over robot transfer plane, then the transfer robot 214 extends into the mask stocker 220, and mask cassette 224 lowers the mask 260 onto the transfer robot 214. Thereafter, the blade 215 of the transfer robot 214 is extracted from the mask stocker 220, the transfer robot 214 rotates to an alignment module 140, and the transfer robot 214 extends to position the mask 260 over the alignment module 140.

At operation 530, the mask 260 can be aligned with the substrate 252 and carrier 250. Aligning the mask 260 with the substrate 252 can include positioning the mask 260 over the substrate 252 and carrier 250 at a first predetermined distance (operation 532). The first predetermined distance can be about 1 mm to about 8 mm, about 2 mm to about 6 mm, or about 3 mm to about 5 mm, such as about 4 mm. For example, the controller 270 can instruct the transfer robot 214 to position the mask 260 over the substrate 252 and carrier 250. Subsequently, move alignment stage 216 a second predetermined distance between the substrate 252 and the mask 260 (operation 534). For example, the second predetermined distance can be about 0.2 mm to about 0.8 mm, about 0.3 mm to about 0.7 mm, about 0.4 mm to about 0.6 mm, such as about 0.5 mm. Further, aligning the mask 260 with the substrate 252 can include acquiring one or more images of the mask 260, carrier 250 and/or the substrate 252 (operation 536). For example, the controller 270 can instruct the alignment system 216 to acquire one or more images of the mask 260, and the substrate 252. Each of the images can include a view of at least a portion of the substrate 252 through at least a portion of the mask 260. The images can be processed by the controller 270 to determine a difference in alignment between the substrate 252, carrier 250 and/or the mask 260. For example, the controller 270 can determine a distance between an alignment element on the mask 260 and a corresponding alignment element on the substrate 252. The distance can correspond to a distance between a center of an alignment element (e.g., hole) of the mask 260 and a respective alignment element on the substrate 252.

At operation 538, the alignment stage 212 is moved to align a mask 260 with the substrate 252 and/or carrier 250. For example, the controller 270 can instruct the alignment mechanism 314 of the alignment stage 212 to move the alignment surface 312 in one or more directions (e.g., an X-direction, a Y-direction, a Z-direction, and/or a θ-direction) to align the alignment elements on the mask 260 with the alignment elements on the substrate 252. The controller 270 can instruct the alignment stage to move in one or more directions (e.g., an X-direction, a Y-direction, a Z-direction, and/or a θ-direction) based on the distance between the alignment element on the mask 260 and a corresponding alignment element on the substrate 252. For example, moving the alignment stage 212 in one or more directions (e.g., an X-direction, a Y-direction, a Z-direction, and/or a θ-direction) aligns the alignment element on the mask 260 with a corresponding alignment element on the substrate 252. Moving the substrate 252 to align alignment elements of the mask 260 with alignment elements of the substrate 252 can include moving the substrate 252 to position each of the alignment elements of the substrate 252 within a center of a respective one of the alignment elements (e.g., holes) mask 260.

Further, the alignment system 216 can acquire one or more additional images of the mask 260 and the substrate 252 after the alignment stage has been moved to determine if additional adjustments can be needed to align the mask 260 with the substrate 252. For example, the controller 270 can instruct the alignment system 216 to acquire one or more additional images and process those images to determine how much to move the alignment stage 212 in one or more directions (e.g., an X-direction, a Y-direction, a Z-direction, and/or a θ-direction).

At operation 540, a mask is received up by a carrier. For example, the mask 260 is received by the carrier 250 after the mask 260 has been aligned with the substrate 252. The controller 270 can instruct the alignment stage 212 to move vertically until the carrier 250 contacts the mask 260. As the diameter of the carrier 250 and/or the substrate 252 is less than the diameter of the mask 260, and the blade 215 of the transfer robot 214 resides outside the perimeter of the carrier 250 and/or the substrate. Further, as the carrier 250 and the substrate 252 move vertically toward the mask 260, the carrier contacts the mask 260 without the substrate 252 being interfered with by the blade 215 of the transfer robot 214. In one or more embodiments, at operation 542, the carrier 250 with the substrate 252 containing the mask 260 is lifted above the transfer robot 214. At operation 544, the transfer robot 214 is retracted leaving behind the carrier 250 with the substrate 252 containing the mask 260.

At operation 550, the carrier supporting the substrate and the mask is transferred from the alignment module 140. For example, the transfer robot 131 can access the alignment module 140 via the valve assembly 218 to pick up the carrier 250 supporting the substrate 252, and the mask 260. The controller 270 can instruct the valve assembly 218 to open and the controller 150 can instruct the transfer robot 131 to access the alignment module 140 and transfer the carrier 250, the substrate 252 and the mask 260 out of the alignment module 140. The loading pins 310 lift the carrier 250 holding the substrate 252 and the mask 260 away from the alignment surface 312 of the alignment stage 212, placing the carrier 250 into the unloading position such that it can be accessed by the transfer robot 131. The transfer robot 131 picks up the carrier 250 once it has been positioned in the unloading position by the loading pins 310 and transfers the carrier 250, the substrate 252 and the mask 260 out of the alignment chamber.

Figure 6B:
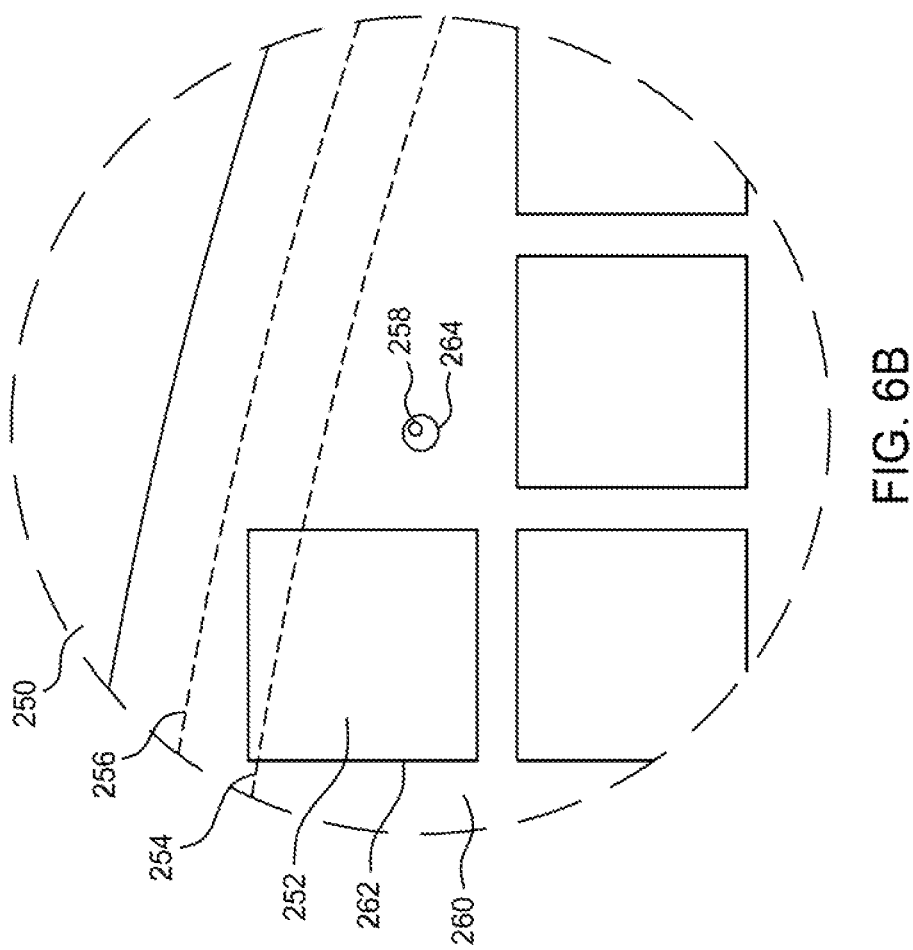
FIGS. 6A and 6B depict schematic illustrations of a mask aligned with and positioned on a substrate, according to one or more embodiments described and discussed herein.
Figure 6A:
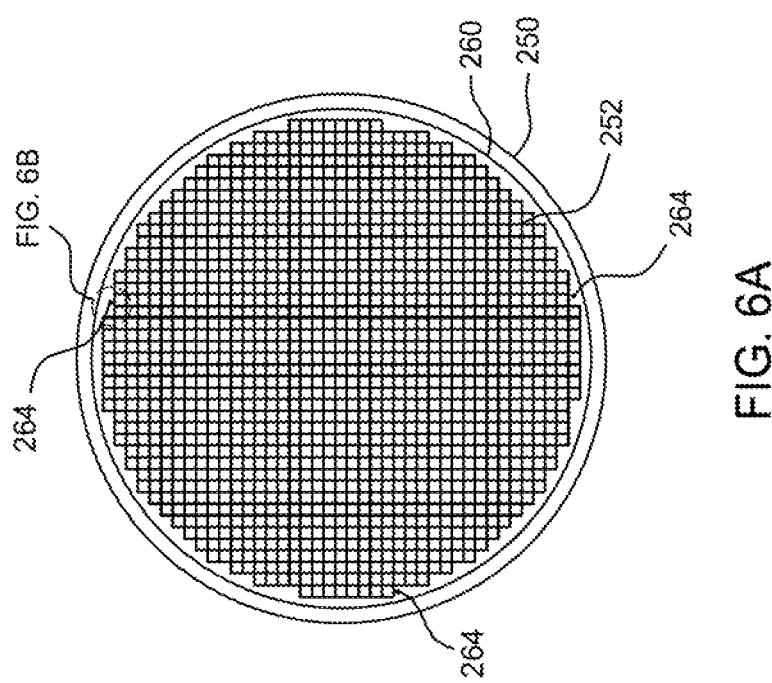

FIGS. 6A and 6B depict schematic illustrations of the mask 260 aligned with and positioned on the substrate 252 disposed on the carrier 250, according to one or more embodiments described and discussed herein. The mask 260 contains one or more mask alignment holes 264 or other alignment elements passing through the mask 260 (three alignment holes 264 are shown in FIG. 6A). The substrate 252 contains one or more substrate alignment dots 258 or other alignment elements disposed on an upper surface of the substrate 252, as illustrated in FIG. 6B. The mask alignment holes 264 or other alignment elements within the masks 260 can be any shape and/or size and can be positioned at specified locations on the mask 260. The mask alignment holes 264 can be or include holes (as shown in FIG. 6A) and/or edges, corners, strips, strip crossings, and/or the like. The substrate alignment dots 258 or other alignment elements disposed on an upper surface of the substrate 252 can be any shape and/or size and can be positioned at specified locations on the substrate 252. The substrate alignment dots 258 can be or include dots (as shown in FIG. 6A) and/or marks, patterns, lines, edges, corners, and/or the like.

Generally, the amount of alignment holes 264 correspond to the amount of the alignment dots 258. In one or more examples, the mask 260 contains two, three, four, or more mask alignment holes 264 and the substrate 252 has two, three, four, or more substrate alignment dots 258. Once the mask 260 and the substrate 252 are properly aligned with each other, each mask alignment hole 264 is aligned with a respective substrate alignment dot 258. The mask alignment holes 264 and the substrate alignment dots 258 can independently have any kind of symmetrical or asymmetrical geometry or shape, such as round, oval, rectangular or square, or other shapes.

The diameter of the mask alignment hole 264 or other alignment element is generally greater than the diameter of the substrate alignment dot 258 or other alignment element. In other examples, the diameter of the mask alignment hole 264 or other alignment element can be equal to or less than the diameter of the substrate alignment dot 258 or other alignment element. In one or more embodiments, each of the substrate alignment dot 258, the mask alignment hole 264, and/or other alignment element can independently have a diameter of about 50 µm, about 80 µm, about 100 µm, about 150 µm, about 200 µm, about 250 µm, or about 300 µm to about 350 µm, about 375 µm, about 400 µm, about 500 µm, about 650 µm, about 800 µm, about 1,000 µm, about 1,200 µm, about 1,500 µm, about 1,800 µm, or about 2,000 µm. For example, each of the substrate alignment dot 258, the mask alignment hole 264, and/or other alignment element can independently have a diameter of about 50 µm to about 2,000 µm, about 100 µm to about 2,000 µm, about 100 µm to about 1,500 µm, about 100 µm to about 1,000 µm, about 100 µm to about 800 µm, about 100 µm to about 500 µm, about 100 µm to about 300 µm, about 100 µm to about 250 µm, about 100 µm to about 200 µm, about 250 µm to about 2,000 µm, about 250 µm to about 1,500 µm, about 250 µm to about 1,000 µm, about 250 µm to about 800 µm, about 250 µm to about 500 µm, about 250 µm to about 300 µm, about 375 µm to about 2,000 µm, about 375 µm to about 1,500 µm, about 375 µm to about 1,000 µm, about 375 µm to about 800 µm, or about 375 µm to about 500 µm.

In some embodiments, the mask alignment hole 264 is radially positioned between a pattern in the mask 260 (e.g., die pattern containing plurality of openings 262) and a substrate exclusion zone 254 of the substrate 252. The substrate exclusion zone 254 is a boundary area radially positioned on the upper surface of the substrate 252 disposed between the patterned portions of the substrate 252 and the substrate edge 256.

In one or more embodiments, a method for aligning the mask 260 with the substrate 252 includes receiving the carrier 250 having the substrate 252 disposed on a surface of the carrier 250 at the alignment stage 212 of the alignment module 140. The method also includes transferring the mask 260 via a transfer robot 214 or other transfer device from the mask cassette 224 of the mask stocker 220 or 230 of the alignment module 140 to a position over the alignment stage 212. The mask 260 can be positioned or otherwise disposed on the carrier 250 by moving the alignment stage 212 vertically toward the transfer robot 214 to position the mask 260 on the carrier 250. The method can also include acquiring one or more images of the mask 260 and the substrate 252, analyzing the one or more images to determine one or more differences between one, two, three, or more alignment elements of the mask 260 (e.g., the mask alignment holes 264) and one, two, three, or more alignment elements on the substrate 252 (e.g., the substrate alignment dots 258), and aligning the mask 260 with the substrate 252 based on the one or more differences. For example, the mask 260 can include one, two, three, or more mask alignment holes 264 passing through the mask 260 and the substrate 252 can include one, two, three, or more substrate alignment dots 258 disposed on an upper surface of the substrate 252. One, two, three, or more cameras can be positioned to acquire the images of the alignment elements of the mask 260 and/or the substrate 252. As such, the mask 260 can be aligned with the substrate 252 by moving the alignment stage 212 to adjust a position of the substrate 252 with respect to the mask 260. The mask alignment holes 264 or other alignment elements on the mask 260 can be aligned with the substrate alignment dots 258 or other alignment elements on the substrate 252.

In some examples, the mask 260 with the substrate 252 can be aligned by moving the alignment stage 212 to adjust a position of the substrate 252 with respect to the mask 260. In other examples, the mask 260 can be positioned on the carrier 250 by moving the alignment stage 212 vertically toward the transfer robot 214 to position the mask 260 on the carrier 250. Further elements of an alignment method can include receiving the carrier 250 containing or otherwise carrying the substrate 252 and the mask 260 at the alignment stage 212, catching the mask 260 with the transfer robot 214, and moving the alignment stage 212 vertically away from the transfer robot 214 to disengage the mask 260 from the carrier 250.

FIG. 5B depicts a flow chart of a method 600 for removing a mask from a carrier, according to one or more embodiments described and discussed herein. At operation 610, a carrier 250 carrying the substrate 252, and the mask 260 is transferred into the alignment module 140. Further, the controller 270 can instruct the alignment stage 212 to move the loading pins 310 away from the alignment surface 312 such that they are positioned into the loading position. The controller 150 can instruct the transfer robot 131 to transfer the carrier 250, the substrate 252 and the mask 260 through the valve assembly 218 and onto the loading pins 310. After the carrier 250 is placed on the loading pins 310, the controller 270 can instruct the alignment stage 212 to move the loading pins 310 toward the alignment surface 312 until the carrier 250 is supported by the alignment surface 312. At operation 620, the mask 260 is removed from the carrier 250. For example, the controller 270 can instruct the transfer robot 214 to position the blade 215 along the edges of the mask 260 (operation 622) such that the mask is at least partially supported by the transfer robot 214. At operation 624 the alignment stage is lowered disengaging the carrier from the mask. For example, the controller 270 can instruct the alignment stage 212 to move vertically away from the transfer robot 214, and as the alignment stage 212 is lowered the mask 260 is held and supported by the transfer robot 214.

In some examples of operation 620, the mask 260, the substrate 252, and the carrier 250 are lifted above robot transfer plane, then the transfer robot 214 is extended over the alignment station. Thereafter, the lift pins are lowered leaving the mask 260 on the transfer robot 214 and the substrate 252 and the carrier 250 on the alignment stage 216, and the transfer robot 214 is retracted from the alignment stage 216 and moved into the slot of the mask stocker 220. The mask stocker 220 lift is then raised to place the mask 260 in the mask cassette 224, and then the transfer robot 214 is retracted from the mask cassette 224.

At operation 630, the mask is transferred to a mask stocker. For example, the controller 270 instructs the transfer robot 214 to transfer the mask 260 to one of the mask stocker 220 and 230. At operation 632, an open slot in a mask cassette is vertically aligned with a valve assembly. For example, the vertical actuator 226 is instructed by the controller 270 to move the mask cassette 224 along path 440 to align an open slot 450 of the mask cassette 224 with the slit valve assembly 222. At operation 634, the transfer robot 214 transfers the mask 260 into the open slot 450. For example, the controller 270 can instruct the slit valve assembly 222 to open and the transfer robot 214 to transfer the mask 260 through the slit valve assembly 222 into the open slot of the mask cassette 224.

Figure 7:
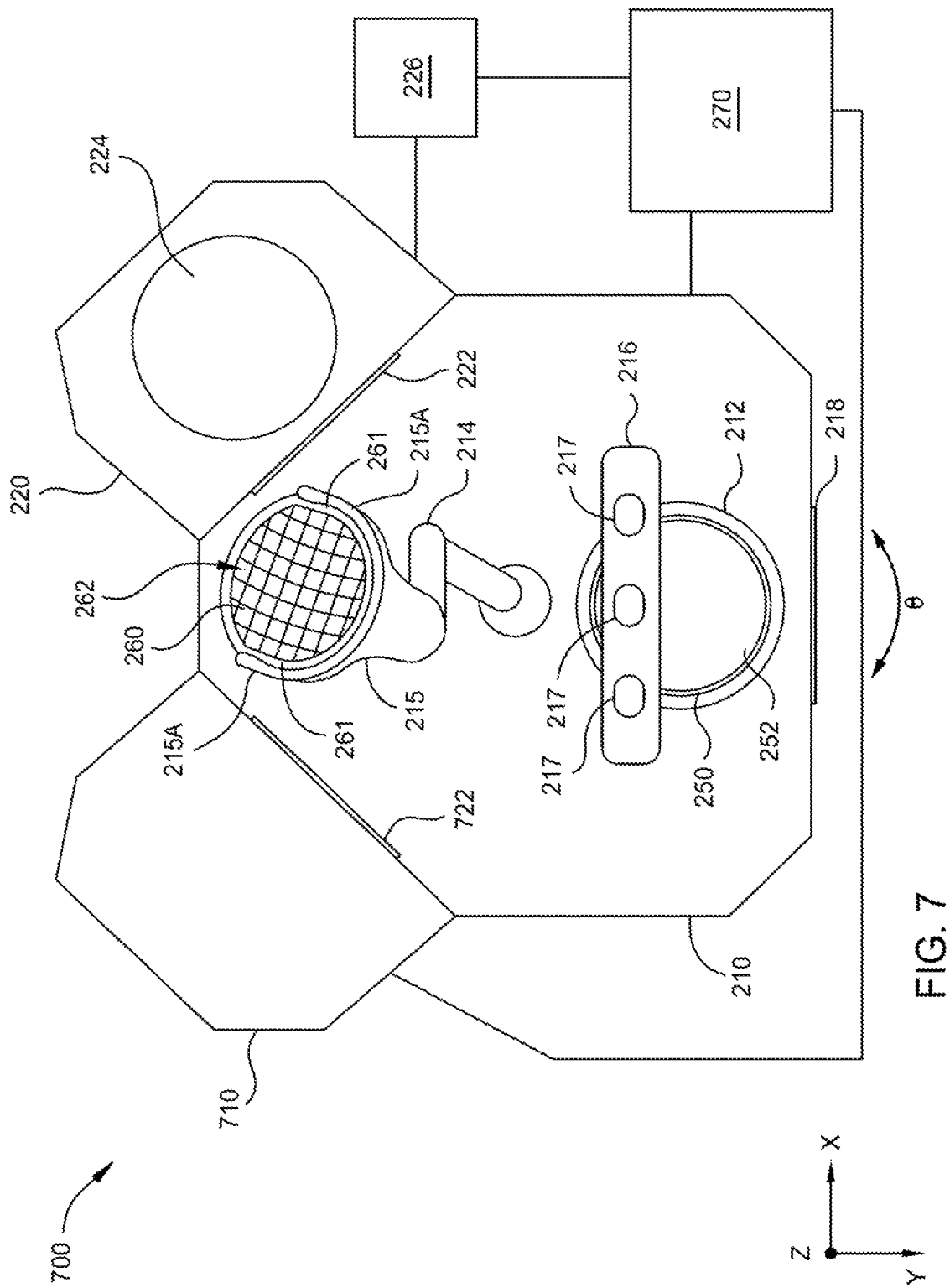
FIG. 7 depicts a schematic illustration of an alignment module, according to one or more embodiments described and discussed herein.

FIG. 7 depicts an alignment module 700, according to one or more embodiments described and discussed herein. The alignment module 700 is configured similar to that of the alignment module 140; however, the alignment module 700 includes a cleaning chamber 710 where the alignment module 140 includes the mask stocker 230. The cleaning chamber 710 can be configured to clean one or more masks to remove material buildup from the masks. The cleaning chamber 710 includes a valve assembly 722 configured to isolate the interior volume of the cleaning chamber 710 from the alignment chamber 210.

During the various deposition processes utilized to deposit the one or more layers of organic or metal films on a substrate, the masks experience a buildup of organic or metal materials. Overtime the buildup of organic or metal material begins to hinder the ability of the mask to be used during the deposition process and the masks can become unusable if they are not cleaned to remove the deposited material. However, removing the masks from the mask stocker 220 for cleaning is time intensive and can cause damage while the masks are handled and moved to another chamber to be cleaned. Thus, by the cleaning of the masks within the alignment module 700, the lifetime usefulness of the masks is increased and the possibility that the masks are damaged during cleaning is reduced. Further, cleaning the masks within the alignment module 700 reduces down time of the alignment module 700, as the alignment module 700 does not need to be taken off-line to remove the masks for cleaning.

Figure 8A:
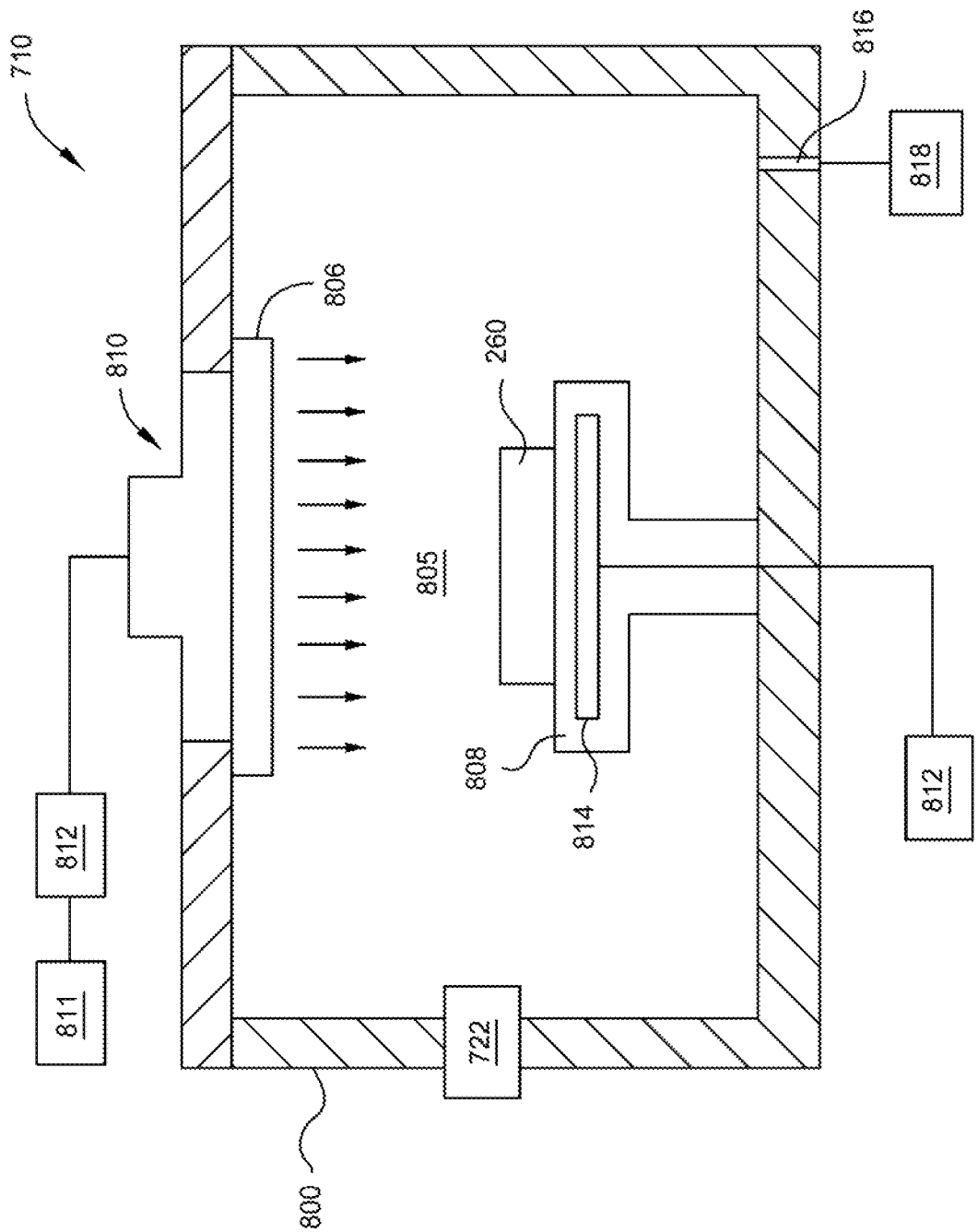
FIGS. 8A and 8B depict schematic illustrations of a cleaning chamber, according to one or more embodiments described and discussed herein.

FIG. 8A is a schematic illustration of a cross-section of the cleaning chamber 710, according to one implementation of the present disclosure. The cleaning chamber 710 includes a chamber body 800 having a support pedestal 808 for supporting masks 260 thereon. Additionally, the cleaning chamber 710 includes a lid assembly 810 configured to introduce one or more cleaning gases into a processing volume 805 of the chamber body 800. For example, the lid assembly 810 can be coupled to a gas supply source 811 that provides the cleaning gases to the lid assembly 810. The gas supply source 811 can include a remote plasma source (RPS) 812 configured to generate a plasma and flow the generated plasma into the chamber body 800 or any other type of gas supply source.

The lid assembly 810 includes a showerhead 806 that introduces one or more gases into the processing volume 805. The gases can be or include one or more cleaning gases, such as one or more oxygen-containing gases and/or one or more halogen-containing gases. Exemplary cleaning gas can be or include one or more of oxygen ($O_2$), ozone, water, bromine ($Br_2$), hydrogen chloride (HCl), chlorine ($Cl_2$), nitrogen trifluoride ($NF_3$), fluorine ($F_2$), hydrogen fluoride (HF), or any combination thereof. The cleaning gas is introduced into the processing volume 805 and reacts on or above the mask 260 for the purposes of removing material from the mask 260. For example, a plasma can be created in the processing volume 805 to facilitate removal of material from the mask 260. The chamber body 800 can include one or more power supplies 817 that propagate radio frequency (RF) energy, direct current (DC) voltage, and/or alternating current (AC) throughout the substrate process chamber 804 and/or components thereof. For example, the one or more power supplies 817 can drive the biasing electrode 814 with an RF signal to generate the plasma within the processing volume 805. Additionally, or alternatively, the one or more power supplies 817 can drive the showerhead 824 with an RF signal to generate the plasma within the processing volume 805.

Further, the chamber body 800 can include one or more heaters and/or one or more cooling channels, such as in the support pedestal 808, that control the temperatures of various components and aspects of the substrate process chamber 804.

Additionally, the chamber body 800 includes an exhaust opening 816 which is fluidly connected to a vacuum pump 818. The vacuum pump 818 is configured to exhaust gases from the processing volume 805 through the exhaust opening 816. Further, the chamber body 800 includes the valve assembly 722 through which the mask 260 is inserted into the chamber body 800 and removed from the chamber body 800.

Figure 8B:
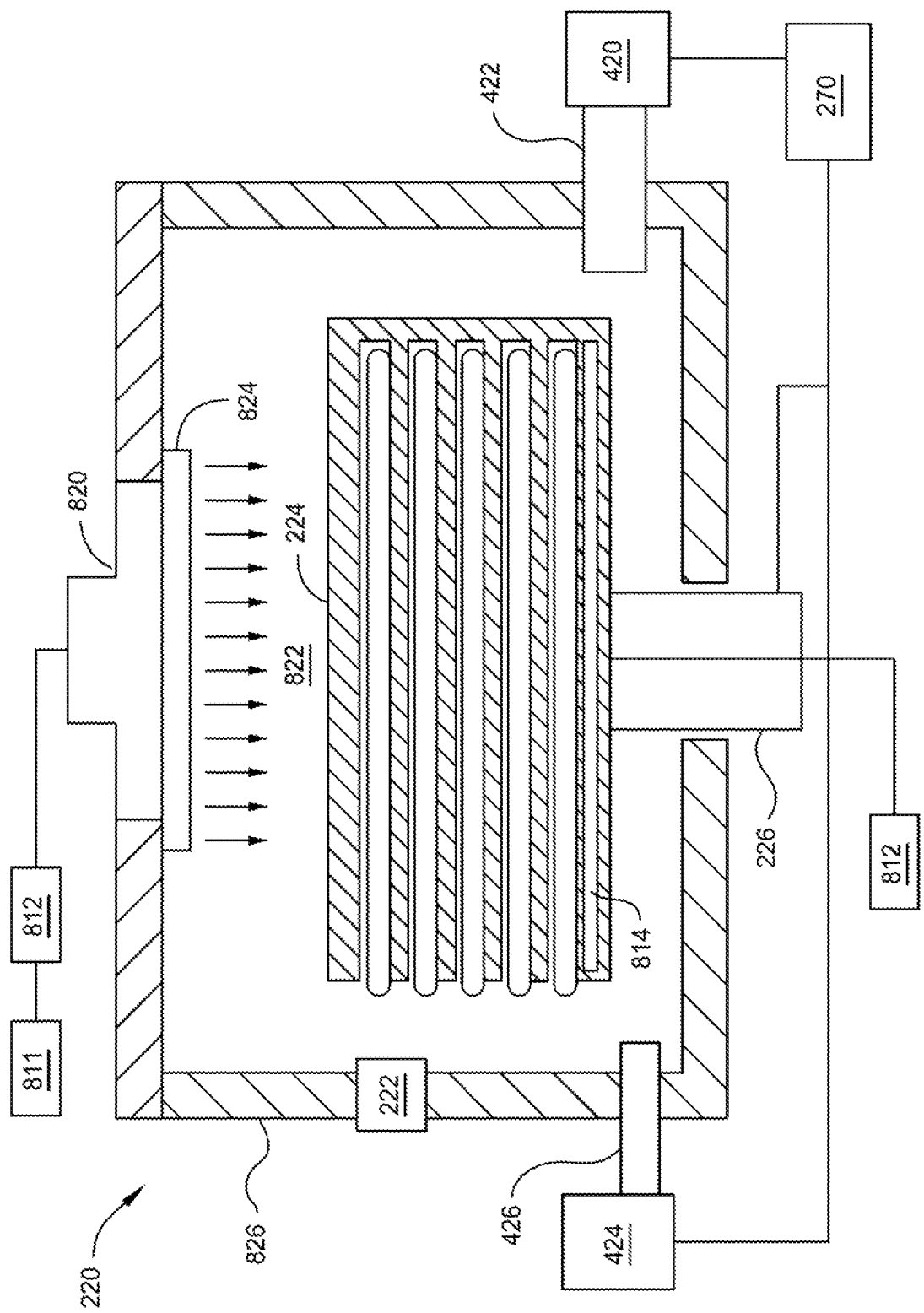

Additionally, or alternatively, a mask stocker can be configured for both mask storage and mask cleaning. For example, one or more of the mask stockers 220 and 230 can be configured similar to that of the cleaning chamber 710. For example, one or more of the mask stockers 220 and 230 can be configured to act as both a storage location for masks and also as a cleaning chamber to clean the masks. FIG. 8B depicts the mask stocker 220 configured for both mask storage and mask cleaning. The mask stocker 220 includes the lid assembly 820 which is coupled to the gas supply source 811 that provides the cleaning gases to the lid assembly 820. The gas supply source 811 can include RPS 812 configured to generate a plasma and flow the generated plasma into the processing volume 822 or any other type of gas supply source.

The lid assembly 820 is configured similar to that of the lid assembly 810 of FIG. 8A. For example, the lid assembly 820 includes a showerhead 824 that introduces gases into the processing volume 822. Further, a plasma can be created in the processing volume 822 to facilitate removal of material from one or more masks 260. To generate the plasma, one or more power supplies 817 can be utilized to propagate RF energy, DC voltage, and/or AC throughout the substrate process chamber 826 and/or components thereof. For example, the one or more power supplies 817 can drive the biasing electrode 814 with an RF signal to generate the plasma within the processing volume 805. The biasing electrode 814 can be positioned anywhere within the mask cassette 224. Further, more than one biasing electrode 814 can be included with the mask cassette 224. Each of the biasing electrodes 814 can be simultaneously driven by the one or more power supplies 817. Alternatively, a first one or more of the biasing electrodes 814 can be driven during a first period, and a second one or more of the biasing electrodes 814 can be driven during a second period that is non-overlapping with the first period. Additionally, or alternatively, the one or more power supplies 817 can drive the showerhead 824 with an RF signal to generate the plasma within the processing volume 805. Further, the vacuum pump 420 can exhaust gases from the processing volume 822 via gas outlet 422. Additionally, the gas supply source 424 and gas inlet 426 can be omitted in embodiments where the mask stocker 220 is configured for both mask storage and mask cleaning.

Figure 9:
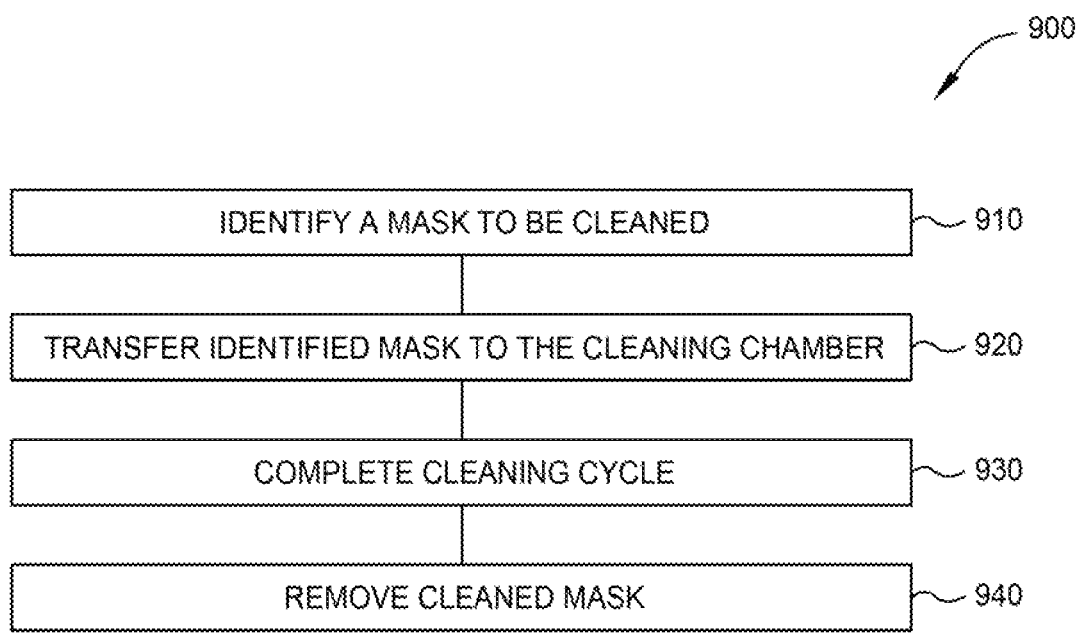
FIG. 9 depicts a flow chart of a method for cleaning a mask, according to one or more embodiments described and discussed herein.

FIG. 9 depicts an example flowchart of method 900 for cleaning a mask, according to one or more embodiments described and discussed herein. At operation 910, a mask to be cleaned is identified. For example, the controller 270 can determine that a mask, e.g., mask 260, is ready to be cleaned based on one or more parameters. The one or more parameters can include the type of deposition for which the mask is utilized, a threshold number of deposition processes performed using the mask and/or a period of time between one or more deposition steps. The threshold number of deposition processes can include one or more deposition processes. The controller 270 can identify that a mask should be cleaned in response to the mask undergoing (e.g., exceeding) a threshold number of deposition cycles. The controller 270 can track the number of deposition cycles each mask undergoes, and trigger a cleaning cycle in response to the deposition cycles for a corresponding mask. Further, masks utilized during the deposition of different materials can experience different amounts and/or rates of buildup of deposition material. For example, masks utilized during the deposition of organic materials can experience buildup faster and require more frequent cleanings than masks utilized during the deposition of metal materials. Accordingly, a determination that a second mask should be cleaned can be based on second one or more parameters that are different than the first one or more parameters. For example, the second one or more parameters can correspond to a deposition processes that is different than that of the first one or more parameters, and a second threshold number of deposition processes that differs from the first threshold number. The second threshold number can be greater than or less than the first threshold number. Further, the first deposition process can correspond to the deposition of organic layers and the second deposition process can correspond to the deposition of metal layers.

At operation 920, a mask identified to be cleaned is transferred to the cleaning chamber. For example, the controller 270 can instruct the transfer robot 214 to transfer a mask from the alignment stage 212 after the completion of a deposition cycle or from the mask stocker 230. The transfer robot 214 can transfer the mask through the valve assembly 722 and position the mask on the support pedestal 808.

At operation 930, a cleaning cycle is completed. After the transfer robot 214 has positioned the mask 260 on the support pedestal 808 and is removed from the processing volume 805, the controller 270 instructs the valve assembly 722 to isolate the processing volume 805 from the alignment chamber 210 and a cleaning cycle can be completed. For example, the controller 270 can instruct the gas supply source 811 to flow one or more cleaning gases into the processing volume 805 through the lid assembly 810 and the showerhead 806. Further, the controller 270 can instruct the power supply 817 to drive the biasing electrode 814 with an RF signal to ignite the cleaning gas to generate a plasma containing the cleaning gas. At the completion of the cleaning cycle, the controller 270 instructs the power supply 817 to cease driving the biasing electrode 814 with the RF signal, and any remaining cleaning gases are removed from the processing volume 805 via the vacuum pump 818.

At operation 940, the cleaned mask is removed from the cleaning chamber. For example, the controller 270 can instruct the valve assembly 722 to open and the transfer robot 214 to transfer the cleaned mask 260 from the cleaning chamber 710. The cleaned mask can be transferred to the mask stocker 220 or transferred to the alignment stage 212 to be loaded onto a carrier and utilized during deposition.

Embodiments of the present disclosure further relate to any one or more of the following paragraphs 1-16:

1. A method for aligning a mask with a substrate, comprising: receiving a carrier having the substrate disposed on a surface of the carrier at an alignment stage of an alignment module; transferring, via a transfer robot, the mask from a mask cassette of a mask stocker of the alignment module to a position over the alignment stage; and positioning the mask on the carrier.

2. A method for aligning a mask with a substrate, comprising: receiving a carrier having the substrate disposed on a surface of the carrier at an alignment stage of an alignment module; transferring the mask from a mask cassette of a mask stocker of the alignment module to a position over the alignment stage; positioning the mask on the carrier; acquiring one or more images of the mask and the substrate, wherein the mask comprises one or more alignment holes passing through the mask and the substrate comprises one or more alignment dots disposed on an upper surface of the substrate; analyzing the one or more images to determine one or more differences between one or more alignment holes of the mask and one or more alignment dots on the substrate; and aligning the mask with the substrate based on the one or more differences.

3. A method for aligning a mask with a substrate, comprising: receiving a carrier having the substrate disposed on a surface of the carrier at an alignment stage of an alignment module; transferring, via a transfer robot, the mask from a mask cassette of a mask stocker of the alignment module to a position over the alignment stage; positioning the mask on the carrier by moving the alignment stage vertically toward the transfer robot to position the mask on the carrier; acquiring one or more images of the mask and the substrate; analyzing the one or more images to determine one or more differences between one or more alignment elements of the mask and one or more alignment elements on the substrate; and aligning the mask with the substrate based on the one or more differences by moving the alignment stage to adjust a position of the substrate with respect to the mask.

4. The method according to any one of paragraphs 1-3, further comprising: acquiring one or more images of the mask and the substrate; analyzing the one or more images to determine one or more differences between one or more alignment elements of the mask and one or more alignment elements on the substrate; and aligning the mask with the substrate based on the one or more differences.

5. The method according to any one of paragraphs 1-4, wherein aligning the mask with the substrate further comprises moving the alignment stage to adjust a position of the substrate with respect to the mask.

6. The method according to any one of paragraphs 1-5, wherein the mask comprises an alignment hole passing through the mask and the substrate comprises an alignment dot disposed on an upper surface of the substrate, and wherein aligning the mask with the substrate further comprises aligning the alignment hole with the alignment dot.

7. The method according to any one of paragraphs 1-6, wherein aligning the mask with the substrate further comprises aligning two or more alignment holes with two or more alignment dots, each alignment hole is aligned with a respective alignment dot.

8. The method according to any one of paragraphs 1-7, wherein the alignment hole has a diameter of about 100 µm to about 1,000 µm, about 250 µm to about 750 µm, or about 375 µm to about 500 µm.

9. The method according to any one of paragraphs 1-8, wherein the diameter of the alignment hole is greater than the diameter of the alignment dot.

10. The method according to any one of paragraphs 1-9, wherein the alignment hole is radially positioned between a pattern in the mask and a substrate exclusion zone of the substrate.

11. The method according to any one of paragraphs 1-10, wherein positioning the mask on the carrier comprises moving the alignment stage vertically toward the transfer robot to position the mask on the carrier.

12. The method according to any one of paragraphs 1-11, further comprising: receiving the carrier carrying the substrate and the mask at the alignment stage, catching the mask with the transfer robot, and moving the alignment stage vertically away from the transfer robot to disengage the mask from the carrier.

13. The method according to any one of paragraphs 1-12, wherein each alignment element of the mask is an alignment hole passing through the mask, wherein each alignment element of the substrate is an alignment dot disposed on an upper surface of the substrate, and wherein aligning the mask with the substrate further comprises respectively aligning each alignment hole with each alignment dot.

14. An apparatus, a system, a module, and/or an integrated platform for conducting, performing, or executing any of the methods according to any one of paragraphs 1-13.

15. An alignment module for aligning a mask with a substrate, comprising: a mask stocker configured house a mask cassette configured to store a plurality of masks; an alignment stage configured to support a carrier and a substrate; a transfer robot configured to transfer a mask of the plurality of masks from the mask stocker to the alignment stage and position the mask over the substrate; and a controller configured to control the system to conduct, perform, or execute any of the methods according to any one of paragraphs 1-13.

16. The alignment module of paragraph 15, wherein the controller is configured to control the system to: receive the carrier having the substrate disposed on a surface of the carrier at the alignment stage of the alignment module; transfer, via the transfer robot, the mask from a mask cassette of a mask stocker of the alignment module to a position over the alignment stage; position the mask on the carrier by moving the alignment stage vertically toward the transfer robot to position the mask on the carrier; acquire one or more images of the mask and the substrate; analyze the one or more images to determine one or more differences between one or more alignment elements of the mask and one or more alignment elements on the substrate; and align the mask with the substrate based on the one or more differences by moving the alignment stage to adjust a position of the substrate with respect to the mask.

While the foregoing is directed to embodiments of the disclosure, other and further embodiments can be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for aligning a mask with a substrate, comprising:
   receiving a carrier having the substrate disposed on a surface of the carrier at an alignment stage of an alignment module, wherein the substrate comprises an alignment dot disposed on an upper surface of the substrate;
   transferring, via a transfer robot, the mask from a mask cassette of a mask stocker of the alignment module to a position over the alignment stage, wherein the mask comprises an alignment hole passing through the mask, and wherein the alignment hole has a diameter of about 50 µm to about 2,000 µm; and
   positioning the mask on the carrier.

2. The method of claim 1, further comprising:
   acquiring one or more images of the mask and the substrate;
   analyzing the one or more images to determine one or more differences between one or more alignment elements of the mask and one or more alignment elements on the substrate, wherein at least one of the alignment elements of the mask is the alignment hole and at least one of the alignment elements on the substrate is the alignment dot; and
   aligning the mask with the substrate based on the one or more differences.

3. The method of claim 2, wherein aligning the mask with the substrate further comprises moving the alignment stage to adjust a position of the substrate with respect to the mask.

4. The method of claim 3, wherein aligning the mask with the substrate further comprises aligning the alignment hole with the alignment dot.

5. The method of claim 4, wherein aligning the mask with the substrate further comprises aligning two or more alignment holes with two or more alignment dots, each alignment hole is aligned with a respective alignment dot.

6. The method of claim 4, wherein the alignment hole has a diameter of about 250 µm to about 750 µm.

7. The method of claim 4, wherein the diameter of the alignment hole is greater than the diameter of the alignment dot.

8. The method of claim 4, wherein the alignment hole is radially positioned between a pattern in the mask and a substrate exclusion zone of the substrate.

9. The method of claim 1, wherein positioning the mask on the carrier comprises moving the alignment stage vertically toward the transfer robot to position the mask on the carrier.

10. The method of claim 1, further comprising:
receiving the carrier carrying the substrate and the mask at the alignment stage;
catching the mask with the transfer robot; and
moving the alignment stage vertically away from the transfer robot to disengage the mask from the carrier.

11. A method for aligning a mask with a substrate, comprising:
receiving a carrier having the substrate disposed on a surface of the carrier at an alignment stage of an alignment module;
transferring the mask from a mask cassette of a mask stocker of the alignment module to a position over the alignment stage;
positioning the mask on the carrier;
acquiring one or more images of the mask and the substrate, wherein the mask comprises one or more alignment holes passing through the mask and the substrate comprises one or more alignment dots disposed on an upper surface of the substrate, wherein the alignment hole has a diameter of about 50 µm to about 2,000 µm, and wherein the diameter of the alignment hole is greater than the diameter of the alignment dot;
analyzing the one or more images to determine one or more differences between one or more alignment holes of the mask and one or more alignment dots on the substrate; and
aligning the mask with the substrate based on the one or more differences.

12. The method of claim 11, wherein aligning the mask with the substrate further comprises moving the alignment stage to adjust a position of the substrate with respect to the mask.

13. The method of claim 11, wherein the alignment hole has a diameter of about 100 µm to about 1,000 µm.

14. The method of claim 11, wherein of the alignment hole has a diameter of about 250 µm to about 750 µm.

15. The method of claim 11, wherein the alignment hole is radially positioned between a pattern in the mask and a substrate exclusion zone of the substrate.

16. The method of claim 11, wherein positioning the mask on the carrier further comprises moving the alignment stage vertically toward a transfer robot to position the mask on the carrier.

17. The method of claim 11, further comprising:
receiving the carrier carrying the substrate and the mask at the alignment stage;
catching the mask with a transfer robot; and
moving the alignment stage vertically away from the transfer robot to disengage the mask from the carrier.

18. An alignment module for aligning a mask with a substrate, comprising:
a mask stocker configured house a mask cassette configured to store a plurality of masks;
an alignment stage configured to support a carrier and a substrate;
a transfer robot configured to transfer a mask of the plurality of masks from the mask stocker to the alignment stage and position the mask over the substrate; and
a controller configured to control the system to:
receive the carrier having the substrate disposed on a surface of the carrier at the alignment stage of the alignment module, wherein the substrate comprises an alignment dot disposed on an upper surface of the substrate;
transfer, via the transfer robot, the mask from a mask cassette of a mask stocker of the alignment module to a position over the alignment stage, wherein the mask comprises an alignment hole passing through the mask, and wherein the alignment hole has a diameter of about 50 µm to about 2,000 µm;
position the mask on the carrier by moving the alignment stage vertically toward the transfer robot to position the mask on the carrier;
acquire one or more images of the mask and the substrate;
analyze the one or more images to determine one or more differences between one or more alignment elements of the mask and one or more alignment elements on the substrate, wherein at least one of the alignment elements of the mask is the alignment hole and at least one of the alignment elements on the substrate is the alignment dot; and
align the mask with the substrate based on the one or more differences by moving the alignment stage to adjust a position of the substrate with respect to the mask.

19. The alignment module of claim 18, wherein each alignment hole has a diameter of about 100 µm to about 1,000 µm, and wherein the mask is aligned with the substrate by respectively aligning each alignment hole with each alignment dot.

20. The alignment module of claim 18, wherein the mask comprises three or more alignment holes and the substrate comprises three or more alignment dots.

* * * * *